(12) United States Patent
Asai et al.

(10) Patent No.: US 11,658,601 B2
(45) Date of Patent: May 23, 2023

(54) MOTOR CONTROL DEVICE AND AIR-CONDITIONING APPARATUS HAVING THE SAME

(71) Applicant: Mitsubishi Electric Corporation, Tokyo (JP)

(72) Inventors: Toshiki Asai, Tokyo (JP); Akihiro Tsumura, Tokyo (JP); Yasuhiko Wada, Tokyo (JP); Junji Morimoto, Tokyo (JP); Shigeo Takata, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 105 days.

(21) Appl. No.: 17/432,281

(22) PCT Filed: Apr. 23, 2019

(86) PCT No.: PCT/JP2019/017218
§ 371 (c)(1),
(2) Date: Aug. 19, 2021

(87) PCT Pub. No.: WO2020/217310
PCT Pub. Date: Oct. 29, 2020

(65) Prior Publication Data
US 2022/0345070 A1     Oct. 27, 2022

(51) Int. Cl.
*H02P 29/024* (2016.01)
*H02P 27/08* (2006.01)
*H05K 7/20* (2006.01)

(52) U.S. Cl.
CPC .......... *H02P 29/0243* (2016.02); *H02P 27/08* (2013.01); *H05K 7/20909* (2013.01)

(58) Field of Classification Search
CPC ...... H02P 1/00; H02P 1/10; H02P 1/12; H02P 1/16; H02P 1/18; H02P 1/24; H02P 1/42;
(Continued)

(56) References Cited

U.S. PATENT DOCUMENTS 5,485,446 A    1/1996   Uno et al.
5,619,486 A    4/1997   Uno et al.
(Continued)

FOREIGN PATENT DOCUMENTS

JP    S62-204792 A    9/1987
JP    H04-275095 A    9/1992
(Continued)

OTHER PUBLICATIONS

International Search Report dated Jul. 16, 2019, issued in corresponding International Application No. PCT/JP2019/017218 (and English Machine Translation).

*Primary Examiner* — Antony M Paul
(74) *Attorney, Agent, or Firm* — Posz Law Group, PLC

(57) ABSTRACT

A motor control device includes a power converter that supplies a three-phase voltage to two motors being connected in parallel, a three-phase power line that connects between one of the two motors and the power converter, a branch three-phase power line that connects between the other of the two motors and the power converter, a switching device having two switches that are provided on the branch three-phase power line, a current detection device that detects three-phase currents flowing in the two motors, and a controller. The controller performs a failure determination of the switching device by identifying a phase of a power line in which no current flows in the three-phase power line and the branch three-phase power line, and, when a failure is detected in one of the two switches in the failure determination, controls to change a state of the other switch, which operates normally, to coincide with a state of the failed switch.

7 Claims, 20 Drawing Sheets

(58) Field of Classification Search
CPC ...... H02P 1/54; H02P 1/56; H02P 1/58; H02P 3/00; H02P 6/00; H02P 6/04; H02P 6/12; H02P 6/24; H02P 6/32; H02P 7/00; H02P 7/20; H02P 7/22; H02P 7/29; H02P 29/024; H02P 29/0243; H02P 29/025; H02P 29/028

See application file for complete search history.

(56) References Cited

U.S. PATENT DOCUMENTS

| | | | |
|---|---|---|---|
| 6,088,660 A | 7/2000 | Uno et al. | |
| 8,528,689 B2 * | 9/2013 | Uryu | B62D 5/0487 |
| | | | 701/41 |
| 2005/0218904 A1 | 10/2005 | Shimoyama et al. | |
| 2015/0040597 A1 | 2/2015 | Ariyama et al. | |

FOREIGN PATENT DOCUMENTS

| | | |
|---|---|---|
| JP | H09-135594 A | 5/1997 |
| JP | 2004-173361 A | 6/2004 |
| JP | 2005-318791 A | 11/2005 |
| JP | 2007-259554 A | 10/2007 |
| JP | 2008-253085 A | 10/2008 |
| JP | 2017-118651 A | 6/2017 |
| WO | 2013/145006 A1 | 10/2013 |

\* cited by examiner

FIG. 9

| | U | V | W | U1 | V1 | W1 | U2 | V2 | W2 | DETERMINATION RESULT |
|---|---|---|---|---|---|---|---|---|---|---|
| FAILURE PATTERN 1 | × | O | O | O | O | O | O | O | O | INVERTER U-PHASE FAILURE |
| FAILURE PATTERN 2 | O | × | O | O | O | O | O | O | O | INVERTER V-PHASE FAILURE |
| FAILURE PATTERN 3 | O | O | × | O | O | O | O | O | O | INVERTER W-PHASE FAILURE |
| FAILURE PATTERN 4 | × | O | O | × | O | O | × | O | O | INVERTER U-PHASE FAILURE |
| FAILURE PATTERN 5 | O | × | O | O | × | O | O | × | O | INVERTER V-PHASE FAILURE |
| FAILURE PATTERN 6 | O | O | × | O | O | × | O | O | × | INVERTER W-PHASE FAILURE |
| FAILURE PATTERN 7 | O | O | O | × | O | O | O | O | O | U1-PHASE LINE DISCONNECTION |
| FAILURE PATTERN 8 | O | O | O | O | × | O | O | O | O | V1-PHASE LINE DISCONNECTION |
| FAILURE PATTERN 9 | O | O | O | O | O | × | O | O | O | W1-PHASE LINE DISCONNECTION |
| FAILURE PATTERN 10 | O | O | O | O | O | O | × | O | O | OFF-FAILURE OF SWITCH 9a OR U2-PHASE LINE DISCONNECTION |
| FAILURE PATTERN 11 | O | O | O | O | O | O | O | × | O | V2-PHASE LINE DISCONNECTION |
| FAILURE PATTERN 12 | O | O | O | O | O | O | O | O | × | OFF-FAILURE OF SWITCH 9b OR W2-PHASE LINE DISCONNECTION |
| FAILURE PATTERN 13 | O | O | O | O | O | O | × | × | × | FAILURE PATTERN 10 AND FAILURE PATTERN 11 OR FAILURE PATTERN 10 AND FAILURE PATTERN 12 OR FAILURE PATTERN 11 AND FAILURE PATTERN 12 |

| | U2 | V2 | W2 | DETERMINATION RESULT |
|---|---|---|---|---|
| FAILURE PATTERN 1 | ○ | ○ | ○ | ON-FAILURES OF SWITCHES 9a AND 9b |
| FAILURE PATTERN 2 | ○ | ○ | × | ON-FAILURE OF SWITCH 9a |
| FAILURE PATTERN 3 | × | ○ | ○ | ON-FAILURE OF SWITCH 9b |

MOTOR CONTROL DEVICE AND AIR-CONDITIONING APPARATUS HAVING THE SAME

CROSS REFERENCE TO RELATED APPLICATION

This application is a U.S. National Stage Application of International Application No. PCT/JP2019/017218, filed on Apr. 23, 2019, the contents of which are incorporated herein by reference.

TECHNICAL FIELD

The present disclosure relates to a motor control device, which controls the rotation of a motor by using a power converter, and to an air-conditioning apparatus including the same.

BACKGROUND ART

Motors, such as brushless direct-current (DC) motors, are used for various purposes including driving of fans of air-conditioning apparatuses. In some of motor control devices controlling the rotation of motors, a motor to be driven from among a plurality of motors, which are connected in parallel to one power converter via respective switching devices such as relays, can be selected by switching the switching device. Examples of power converters include an inverter. Applications of such a motor control device include an air-sending device for outdoor units of air-conditioning apparatuses. The air-sending device includes a plurality of motors and respective air-sending fans provided for the motors. By switching the relays according to a required air volume, the motor control device selectively drives some of the air-sending fans, among the plurality of air-sending fans, or drives all of the air-sending fans simultaneously.

A technology is proposed for turning a system power source off for safety when a failure of a relay is detected in a failure determination of the relay in a motor driving device, in which a plurality of motors are connected in parallel to a power converter via respective relays (see, for example, Patent Literature 1).

CITATION LIST

Patent Literature

Patent Literature 1: Japanese Unexamined Patent Application Publication No. 2008-253085

SUMMARY OF INVENTION

Technical Problem

In a motor driving device of Patent Literature 1, because a system power source is turned off when a failure is detected in one relay, all motors are stopped even when motors connected to relays other than the failed relay, can normally operate. Consequently, convenience for the user is impaired.

The present disclosure has been made to solve the above problems, and an object thereof is to provide a motor control device capable of continuing operations of operable motors without stopping all motors even when a failure of a switching device is detected, and an air-conditioning apparatus having the same.

Solution to Problem

A motor control device according to one embodiment of the present disclosure includes a power converter that converts a power into a three-phase voltage and supplies the three-phase voltage to two motors being connected in parallel, a three-phase power line that connects between one of the two motors and the power converter, a branch three-phase power line that is branched off from the three-phase power line and connects between the other of the two motors and the power converter, a switching device having two switches that are provided on power lines of two phases of the branch three-phase power line and switch between an on-state and an off-state, the on-state being a state in which the power line of the corresponding phase is electrically connected between the other motor and the power converter, the off-state being a state in which the power line thereof is disconnected, a current detection device that detects three-phase currents flowing in the two motors, and a controller that controls the power converter and the switching device corresponding to a speed command value and information of a current detected by the current detection device. The controller includes a failure determination unit that performs a failure determination by identifying a phase of a power line in which no current flows in the three-phase power line and the branch three-phase power line to locate a failure position of the switching device, and a switching control unit that, when a failure is detected in one of the two switches in the failure determination, controls to change an on-state or off-state of the other switch, which operates normally, to coincide with a state of the failed switch.

An air-conditioning apparatus according to another embodiment of the present disclosure includes the above-mentioned motor control device, two heat exchangers connected in parallel in a refrigerant circuit, two fans provided for the two respective heat exchangers, and two motors to be controlled by the motor control device and provided for the two respective fans. When a failure occurs in the switching device, the controller controls so that refrigerant does not enter the heat exchanger provided corresponding to the motor to which the switching device is connected via the branch three-phase power line.

Advantageous Effects of Invention

According to an embodiment of the present disclosure, when a failure of the switching device occurs, some of the motors normally operating can continues their operations without the need for stopping all of the motors.

BRIEF DESCRIPTION OF DRAWINGS

FIG. 9 is a diagram showing an example of a table that a memory of the controller shown in FIG. 2 stores.

FIG. 24 is a flowchart showing part of processing to be performed by a controller of Embodiment 5 for controlling drive of a first motor after a switching device is turned on.

DESCRIPTION OF EMBODIMENTS

Embodiment 1

Figure 1:
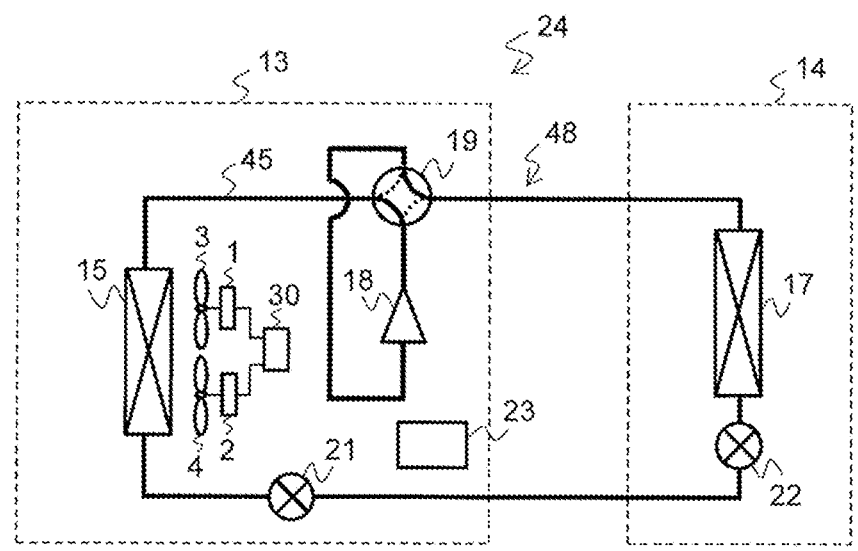
FIG. 1 is a refrigerant circuit diagram showing an example of an air-conditioning apparatus including a motor control device according to Embodiment 1.

A configuration of an air-conditioning apparatus including a motor control device of Embodiment 1 will be explained. FIG. 1 is a refrigerant circuit diagram showing an example of the air-conditioning apparatus including the motor control device according to Embodiment 1. As shown in FIG. 1, an air-conditioning apparatus 24 includes a heat-source-side unit 13 and a load-side unit 14. The heat-source-side unit 13 includes a compressor 18 that compresses and discharges refrigerant, a four-way valve 19 that switches flow directions of refrigerant, a heat-source-side heat exchanger 15 that causes heat exchange to be performed between refrigerant and an outdoor air, a solenoid valve 21 that decompresses and expands refrigerant, and a host controller 23. The heat-source-side unit 13 also includes fans 3 and 4 that supply outdoor air to the heat-source-side heat exchanger 15, a first motor 1 that drives the fan 3, a second motor 2 that drives the fan 4, and a motor control device 30 that supplies a three-phase voltage to the first motor 1 and the second motor 2. The load-side unit 14 includes a load-side heat exchanger 17 that exchanges heat between refrigerant and air of an air-conditioned space, and a solenoid valve 22 that decompresses and expands refrigerant.

Although not shown in FIG. 1, the host controller 23 is connected to the four-way valve 19, the compressor 18, the solenoid valves 21 and 22, and the motor control device 30 via signal lines. The compressor 18, the heat-source-side heat exchanger 15, the solenoid valves 21 and 22, and the load-side heat exchanger 17 are connected by a refrigerant pipe 45 to form a refrigerant circuit 48 in which refrigerant is circulated. The host controller 23 controls a refrigeration cycle of the refrigerant circulating in the refrigerant circuit 48. When the air-conditioning apparatus 24 performs a cooling operation, the heat-source-side heat exchanger 15 functions as a condenser and the load-side heat exchanger 17 functions as an evaporator. When the air-conditioning apparatus 24 performs a heating operation, the heat-source-side heat exchanger 15 functions as an evaporator and the load-side heat exchanger 17 functions as a condenser.

Note that, in the configuration example shown in FIG. 1, the solenoid valves 21 and 22 are installed in the air-conditioning apparatus 24, but either one of the solenoid valves 21 and 22 may be installed. Furthermore, in the configuration example shown in FIG. 1, the fans 3 and 4, the first motor 1, the second motor 2, and the motor control device 30 are provided in the heat-source-side unit 13, but the configuration is not limited thereto. These components may be provided in either or both of the heat-source-side unit 13 and the load-side unit 14.

Although not shown in the drawings, a plurality of temperature sensors, including a room temperature sensor that detects the temperature of an air-conditioned space of the load-side unit 14 and a refrigerant temperature sensor that detects the temperature of refrigerant flowing in a refrigerant device of the heat-source-side heat exchanger 15 or other component, may be provided in the air-conditioning apparatus 24. A pressure sensor that detects the pressure of refrigerant sucked by the compressor 18 may be provided in the compressor 18. The host controller 23 controls the compressor 18 and the solenoid valves 21 and 22 by using detection values of these sensors so that the temperature of the air-conditioned space becomes a temperature set by a user, but a detailed explanation for this control is omitted in Embodiment 1.

Figure 2:
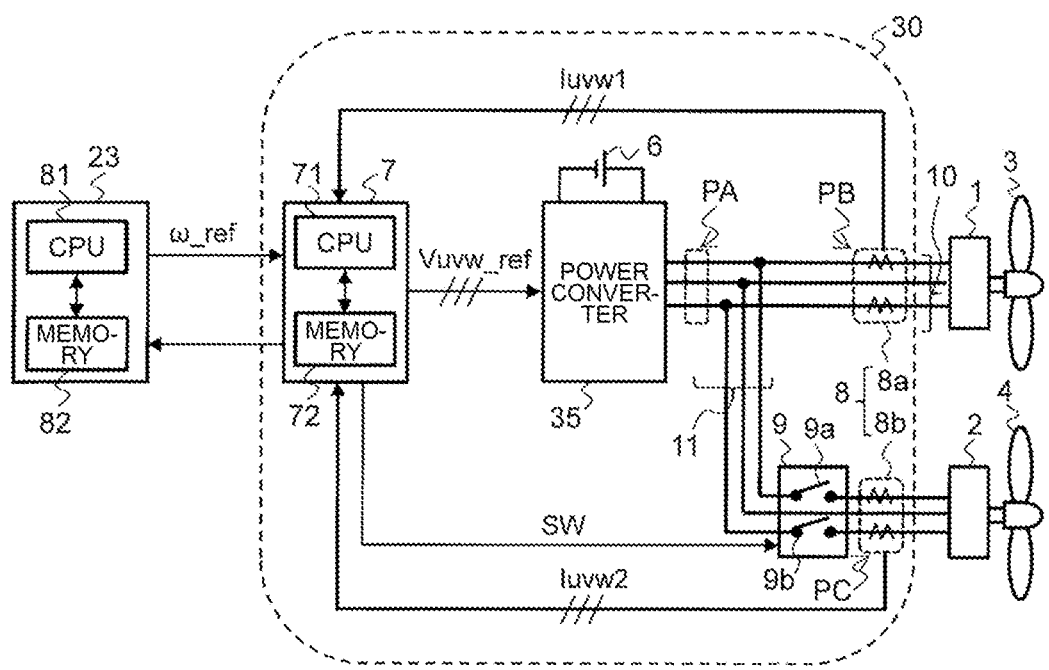
FIG. 2 is a block diagram showing an example of a configuration of the motor control device shown in FIG. 1.
Figure 3:
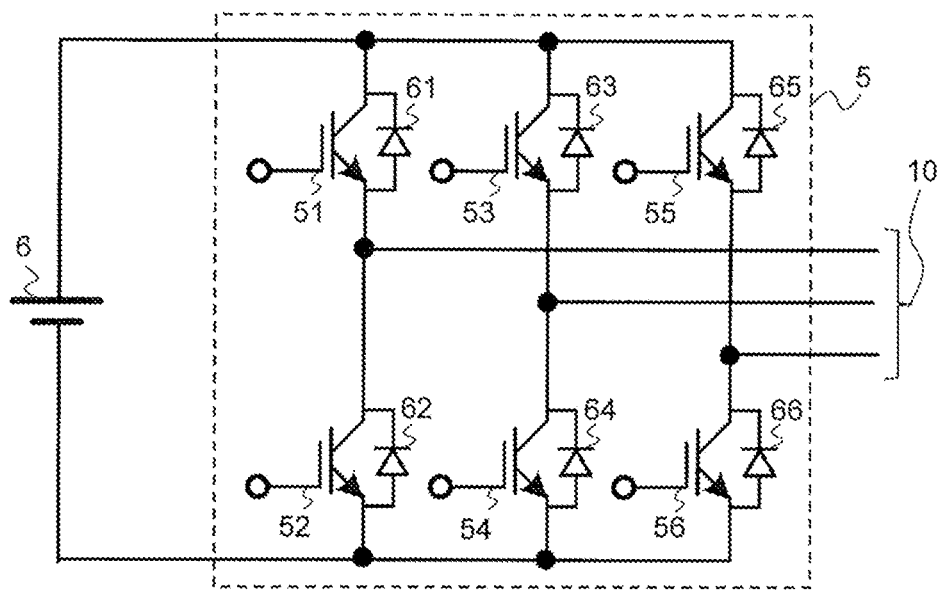
FIG. 3 is a diagram showing an example of a configuration in which the power converter shown in FIG. 2 is an inverter.

FIG. 2 is a block diagram showing an example of a configuration of the motor control device shown in FIG. 1. FIG. 3 is a diagram showing an example of a configuration in which the power converter shown in FIG. 2 is an inverter. The motor control device 30 includes a power converter 35 connected to a power source 6, a controller 7 that controls the operation of the power converter 35, a current detection device 8, and a switching device 9. The first motor 1 and the second motor 2 are connected in parallel to the power converter 35. The power source 6 is a DC voltage power source that supplies power to the first motor 1 and the second motor 2 via the power converter 35. The power source 6 is, for example, a rectifier circuit that converts an alternating-current (AC) voltage, which is supplied from a single-phase power source or a three-phase power source located outside the motor control device 30, into a DC voltage and outputs the converted DC voltage.

As shown in FIG. 2, the first motor 1 is connected to the power converter 35 via a three-phase power line 10. The second motor 2 is connected to a branch three-phase power line 11, which is branched off from the three-phase power line 10. The second motor 2 is connected to the power converter 35 via the branch three-phase power line 11 and the three-phase power line 10. The switching device 9 is provided on the branch three-phase power line 11. The controller 7 is connected to the power converter 35, the current detection device 8, and the switching device 9 via signal lines.

The first motor 1 is provided with the fan 3 and the second motor 2 is provided with the fan 4. The motor control device 30 controls the first motor 1 and the second motor 2 in terms of the number of motors to be driven and the rotation speeds of the motors to be driven, thereby controlling the heat exchanging capacity of the heat-source-side heat exchanger 15.

The first motor 1 and the second motor 2 are brushless DC motors, for example. The first motor 1 and the second motor 2 each have a rotor (not shown) and a stator (not shown). The stator has three-phase windings of U, V, and W phases. The rotor is provided with a permanent magnet. The stator generates a rotating magnetic field around the rotor when a current corresponding to a three-phase voltage applied to each motor from the power converter 35 flows through the corresponding winding.

The brushless DC motor applies, to the stator, a three-phase AC voltage of a proper phase and frequency according to the position of the rotor and generates a rotating magnetic field around the rotor to cause the rotor to rotate at a desired rotation speed by using attraction and repulsion forces generated between the rotating magnetic field and the rotor. At this time, the position of the rotor needs to be detected. Examples of methods for detecting the positon of the rotor include a method in which the position is detected by a hole sensor installed in a motor, and a method in which the position is calculated from a three-phase current flowing in a motor. In Embodiment 1, the motor control device 30 estimates the position of the rotor by calculation from a three-phase current flowing in a motor.

The host controller 23 is, for example, a microcomputer. The host controller 23 includes a memory 82 that stores programs and a central processing unit (CPU) 81 that performs processing in accordance with the programs. The host controller 23 is positioned at an upstream side of the controller 7 in a signal system. The host controller 23 is a controller that issues commands to the controller 7. The commands include, for example, a speed command value $\overline{\omega}\_ref$, which is a command value of the rotation speed of a motor, and a stop command, which instructs to stop the rotation of a motor. Although not shown in the drawings, a remote controller, from which the user inputs an instruction, may be connected to the host controller 23.

Note that the two motors of the first motor 1 and the second motor 2 are hereinafter simply referred to as the motors for convenience of explanation.

Furthermore, although a case where the power converter 35 is an inverter 5 will be explained, the power converter 35 is not limited to the inverter 5 and may be any component capable of converting a DC voltage into an AC voltage.

The current detection device 8 detects a three-phase current Iuvw1 flowing in the first motor 1 and a three-phase current Iuvw2 flowing in the second motor 2. In the configuration example shown in FIG. 2, the position, on the three-phase power line 10, at which a sum of the current flowing in the first motor 1 and the current flowing in the second motor 2 can be detected is referred to as a position PA. Likewise, the position, on the three-phase power line 10, at which only the current flowing in the first motor 1 can be detected is referred to as a position PB. In addition, the position, on the branch three-phase power line 11, at which only the current flowing in the second motor 2 can be detected is referred to as a positon PC. The three phases of the three-phase power line 10 are a U1-phase, a V1-phase, and a W1-phase. The three phases of the branch three-phase power line 11 are a U2-phase, a V2-phase, and a W2-phase. The current detection device 8 detects currents flowing in all the phases based on the currents flowing at each of the positions PA, PB, and PC. In the configuration shown in FIG. 2, the current detection device 8 includes a first current detector 8a that detects currents flowing in the U1-phase and the W1-phase at the position PB, and a second current detector 8b that detects currents flowing in the U2-phase and the W2-phase at the position PC. The first current detector 8a and the second current detector 8b are current transformers, for example.

For the current flowing in the V1-phase, the controller 7 calculates the current based on the values of the currents flowing in the U1-phase and the W1-phase. For the current flowing in the V2-phase, the controller 7 calculates the current based on the values of the currents flowing in the U2-phase and the W2-phase. Furthermore, for the current flowing at the position PA, the controller 7 calculates the current as a sum of the current flowing at the position PB and the current flowing at the position PC.

The positions for current detections are not limited to the positions shown in FIG. 1. Two positions of the position PA and the position PB or two positions of the position PA and the position PC may be used. To detect the current flowing at the position PA, a current detection unit using a shunt resistor may be installed at the inverter 5, instead of installing the current detection device 8 at the position PA. The arrangement position of the current detection device 8 is not limited to the position shown in FIG. 1. For example, the first current detector 8a may detect the currents of the U1-phase and the V1-phase at the position PB.

The switching device 9 includes a switch 9a connected to the power line of the U2-phase and a switch 9b connected to the power line of the W2-phase. The switch 9a electrically connects or disconnects the power line of the U2-phase. The switch 9b electrically connects or disconnects the power line of the W2-phase. When receiving a switching signal SW from the controller 7, the switching device 9 connects the second motor 2 to the three-phase power line 10 or disconnects the second motor 2 from the three-phase power line 10 based on the switching signal SW. The switching signal SW includes a switching signal SW_ON, which changes the switching device 9 to an on-state from an off-state, and a switching signal SW_OFF, which changes the switching device 9 to an off-state from an on-state. The switching device 9 is formed of a relay, for example. In this case, the switch 9a and the switch 9b are contact points of the relay.

There are two types of failure modes of the switching device 9. One of the failure modes is that, even when the controller 7 outputs the switching signal SW_ON to the switching device 9 being in an off state, the switches 9a and 9b are not switched to on-states from off-states. This failure mode is referred to as an off-failure. The off-failure occurs when one or both of the switches 9a and 9b are not switched from off-states to on-states. The other failure mode is that, even when the controller 7 outputs the switching signal SW_OFF to the switching device 9 being in an on-state, the switches 9a and 9b are not switched to off-states from on-states. This failure mode is referred to as an on-failure. The off-failure occurs when one or both of the switches 9a and 9b are not switched from on-states to off-states.

Next, the configuration of the inverter 5 will be explained with reference to FIG. 3. For the U-phase, the inverter 5 includes a switching element 51 connected to the positive electrode side of the power source 6 and a switching element 52 connected to the negative electrode side of the power source 6. A reverse current blocking element 61 is connected in parallel to the switching element 51 and a reverse current blocking element 62 is connected in parallel to the switching element 52. For the V-phase, the inverter 5 includes a switching element 53 connected to the positive electrode side of the power source 6 and a switching element 54 connected to the negative electrode side of the power source 6. A reverse current blocking element 63 is connected in parallel to the switching element 53 and a reverse current blocking element 64 is connected in parallel to the switching element 54. For the W-phase, the inverter 5 includes a switching element 55 connected to the positive electrode side of the power source 6 and a switching element 56 connected to the negative electrode side of the power source 6. A reverse current blocking element 65 is connected in parallel to the switching element 55 and a reverse current blocking element 66 is connected in parallel to the switching element 56.

A three-phase voltage command value Vuvw_ref is input to the inverter 5 from the controller 7. The inverter 5 compares the waveform of the three-phase voltage command value Vuvw_ref with that of a carrier wave and performs power conversion using pulse width modulation (PWM) control. The inverter 5 performs PWM control on the DC voltage of the power source 6 corresponding to the three-phase voltage command value Vuvw_ref received from the controller 7, converts the DC voltage into a three-phase voltage, and supplies the converted voltage to the first motor 1 and the second motor 2. The switching elements 51 to 56 are insulated gate bipolar transistors (IGBTs), for example. The reverse current blocking elements 61 to 66 are diodes, for example.

The controller 7 performs vector control based on the rotation speed command value $\bar{\omega}\_ref$ input from the host controller 23 and the detected three-phase currents Iuvw1 and Iuvw2, and outputs the three-phase voltage command value Vuvw_ref to the inverter 5. The controller 7 also outputs the switching signal SW to the switching device 9. The controller 7 is a microcomputer, for example.

Figure 4:
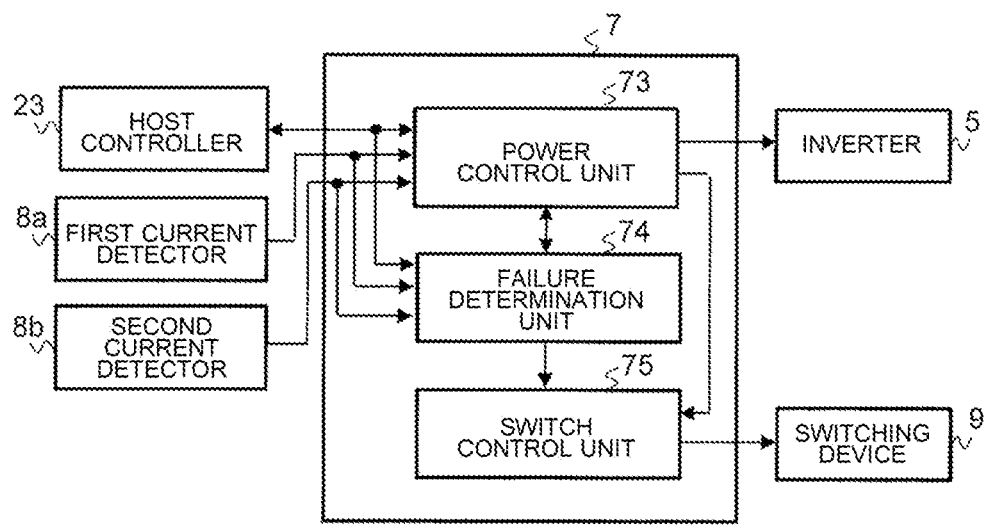
FIG. 4 is a functional block diagram showing an example of a configuration of a controller shown in FIG. 2.

FIG. 4 is a functional block diagram showing an example of a configuration of the controller shown in FIG. 2. As shown in FIG. 2, the controller 7 includes a memory 72 that stores programs and a CPU 71 that performs processing in accordance with the programs. As shown in FIG. 4, the controller 7 includes a power control unit 73, a failure determination unit 74, and a switching control unit 75. By executing the programs by the CPU 71, the power control unit 73, the failure determination unit 74, and the switching control unit 75 are achieved. The power control unit 73 outputs the three-phase voltage command value Vuvw_ref to the inverter 5. The failure determination unit 74 performs a failure determination to locate a failure position of the switching device 9 based on information on the currents detected by the current detection device 8. The switching control unit 75 outputs the switching signal SW to the switching device 9 according to an instruction signal sending from the power control unit 73 for instructing switching of connections. The switching control unit 75 also outputs the switching signal SW to the switching device 9 according to the determination result of the failure determination unit 74.

Figure 5:
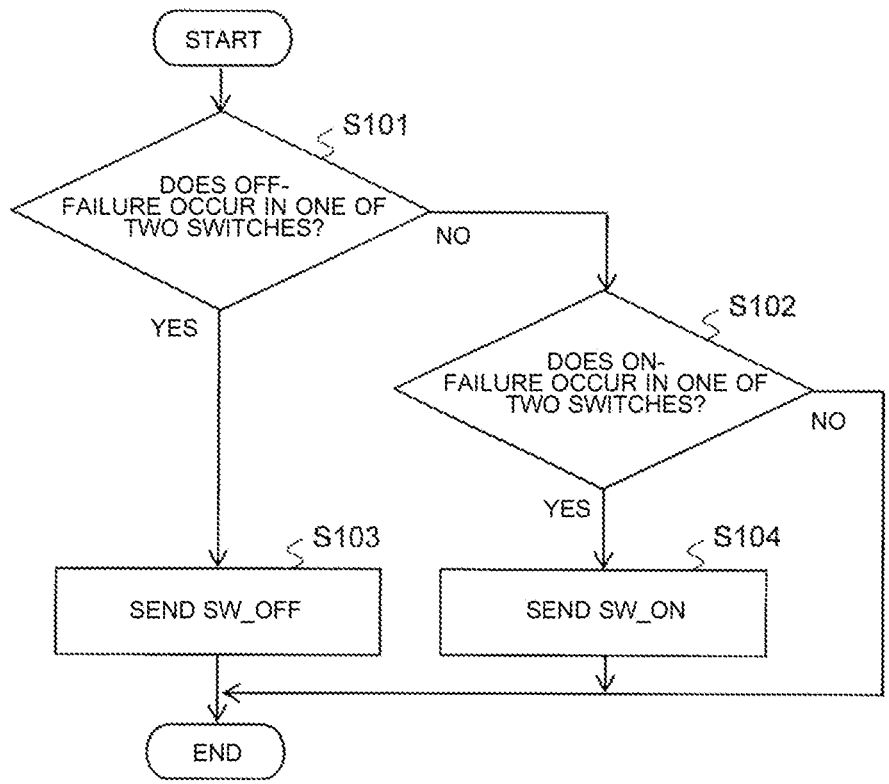
FIG. 5 is a flowchart showing operation procedures of the motor control device according to Embodiment 1.

Next, an operation of the motor control device 30 of Embodiment 1 will be explained. FIG. 5 is a flowchart showing operation procedures of the motor control device according to Embodiment 1. The failure determination unit 74 performs a failure determination of the switching device 9 (steps S101 and S102). The timing of performing the failure determination is, for example, after the switching control unit 75 receives an instruction signal from the power control unit 73 and outputs the switching signal SW corresponding to the received switching signal to the switching device 9.

The failure determination unit 74 determines whether or not an off-failure occurs in the two switches, which are the switches 9a and 9b, connected to the same branch three-phase power line 11 (step S101). When one of the switches has an off-failure, the switching control unit 75 sends the switching signal SW_OFF to the switching device 9 so that the state of the switch normally operating out of the two switches 9a and 9b, is changed to an off-state from an on-state to coincide with the state of the failed switch, which is an off-state (step S103).

Furthermore, the failure determination unit 74 determines whether or not an on-failure occurs in the two switches, which are the switches 9a and 9b, connected to the same branch three-phase power line 11 (step S102). When one of the switches has an on-failure, the switching control unit 75 sends the switching signal SW_ON to the switching device 9 so that the state of the switch normally operating out of the two switches 9a and 9b, is changed to an on-state from an off-state to coincide with the state of the failed switch, which is an on-state (step S104).

As described above, when one of the two switches 9a and 9b connected to the branch three-phase power line 11 has an on-failure or off-failure, the state of the switch normally operating is changed to coincide with the state of the failed switch. As a result, the second motor 2, which is connected to the inverter 5 via the branch three-phase power line 11 having the failed switch connected thereto, is prevented from entering an open-phase state.

The motor control device 30 of Embodiment 1 includes the power converter 35, which supplies a three-phase voltage to the first motor 1 and the second motor 2, the switching device 9 provided on the branch three-phase power line 11, to which the second motor 2 is connected, the current detection device 8, which detects a three-phase current, and the controller 7. The controller 7 includes the failure determination unit 74 and the switching control unit 75. The failure determination unit 74 performs a failure determination of the switching device 9 by identifying the phase having no current flow, out of the three phases of the power line connected to the second motor 2. When the failure determination indicates that a failure is detected in one of the two switches 9a and 9b provided in the switching device 9, the switching control unit 75 changes the on-state or off-state of the switch normally operating to coincide with the state of the failed switch.

The operation and effects of Embodiment 1 will be explained. In Embodiment 1, when one of the two switches 9a and 9b connected to the same branch three-phase power line 11 has an on-failure or off-failure, the state of the switch normally operating is changed to coincide with the state of the failed switch. The second motor 2 is connected to the inverter 5 via the branch three-phase power line 11 having the failed switched connected thereto, and in a case of off-failure, the second motor 2 is prevented from entering an open-phase state by causing the switching device 9 to enter an on-state. In a case of on-failure, the second motor 2 is prevented from entering an open-phase state by causing the switching device 9 to enter an on-state.

When the second motor 2 drives in an open-phase state, a desired drive condition cannot be attained in the second motor 2 and an overcurrent may flow in the second motor 2. In this case, in a related-art controller, the inverter 5 is stopped to protect the second motor 2 and the inverter 5, and thus both of the first motor 1 and the second motor 2 cannot operate. On the other hand, in Embodiment 1, when one of the switches 9a and 9b of the switching device 9 has an off-failure, the switch normally operating is caused to enter an off-state to coincide with the failed switch, as described above. As a result, the second motor 2 is prevented from entering an open-phase state, and continuous operation of the air-conditioning apparatus 24 is made possible because the first motor 1 normally operating is kept in an operable state. In addition, when one of the switches 9a and 9b of the switching device 9 has an on-failure, the switch normally operating is caused to enter an on-state to coincide with the failed switch, as described above. As a result, the second motor 2 is prevented from entering an open-phase state, and continuous operation of the air-conditioning apparatus 24 is made possible because the first motor 1 normally operating is kept in an operable state.

In the air-conditioning apparatus 24 provided with the motor control device 30 of Embodiment 1, when one of the switches 9a and 9b of the switching device 9 has an off-failure, proper control is performed corresponding to the detected failure state, even though the number of operable fans is reduced and thus the capacity is limited. Consequently, emergency operation can be performed by allowing an operable motor to continue the operation without stopping all motors. Likewise, in the air-conditioning apparatus 24 provided with the motor control device 30, when one of the switches 9a and 9b of the switching device 9 has an on-failure, emergency operation can be performed by allowing an operable motor to continue the operation without stopping all motors, even though more air than needed is supplied by the fans.

Embodiment 2

Embodiment 2 is an embodiment of a method of the failure determination described in Embodiment 1. In Embodiment 2, features that are the same as those described in Embodiment 1 will be denoted by the same reference signs, and their detailed descriptions will be omitted.

Figure 6:
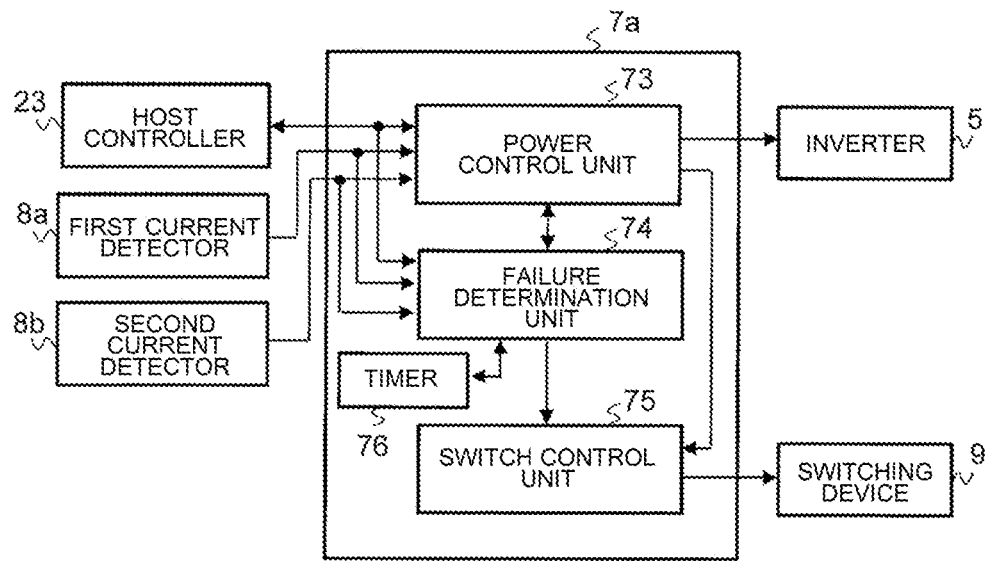
FIG. 6 is a functional block diagram showing an example of a configuration of a controller in a motor control device according to Embodiment 2.

The configuration of the motor control device 30 of Embodiment 2 will be explained. FIG. 6 is a functional block diagram showing an example of a configuration of a controller in a motor control device according to Embodiment 2. In addition to the components of the controller 7 shown in FIG. 4, a controller 7a includes a timer 76 that measures time. In addition, the memory 72 shown in FIG. 2 stores a table for locating failure positions and a plurality of thresholds as reference values for failure determination.

Next, an operation of the motor control device 30 of Embodiment 2 will be explained. Specifically, a method of the failure determination of the switching device 9 that the failure determination unit 74 performs will be explained. In this case, suppose that the current detection device 8 has no failure. The memory 72 stores current thresholds X1 to X4 and time thresholds Tth1 to Tth3.

Figure 7:
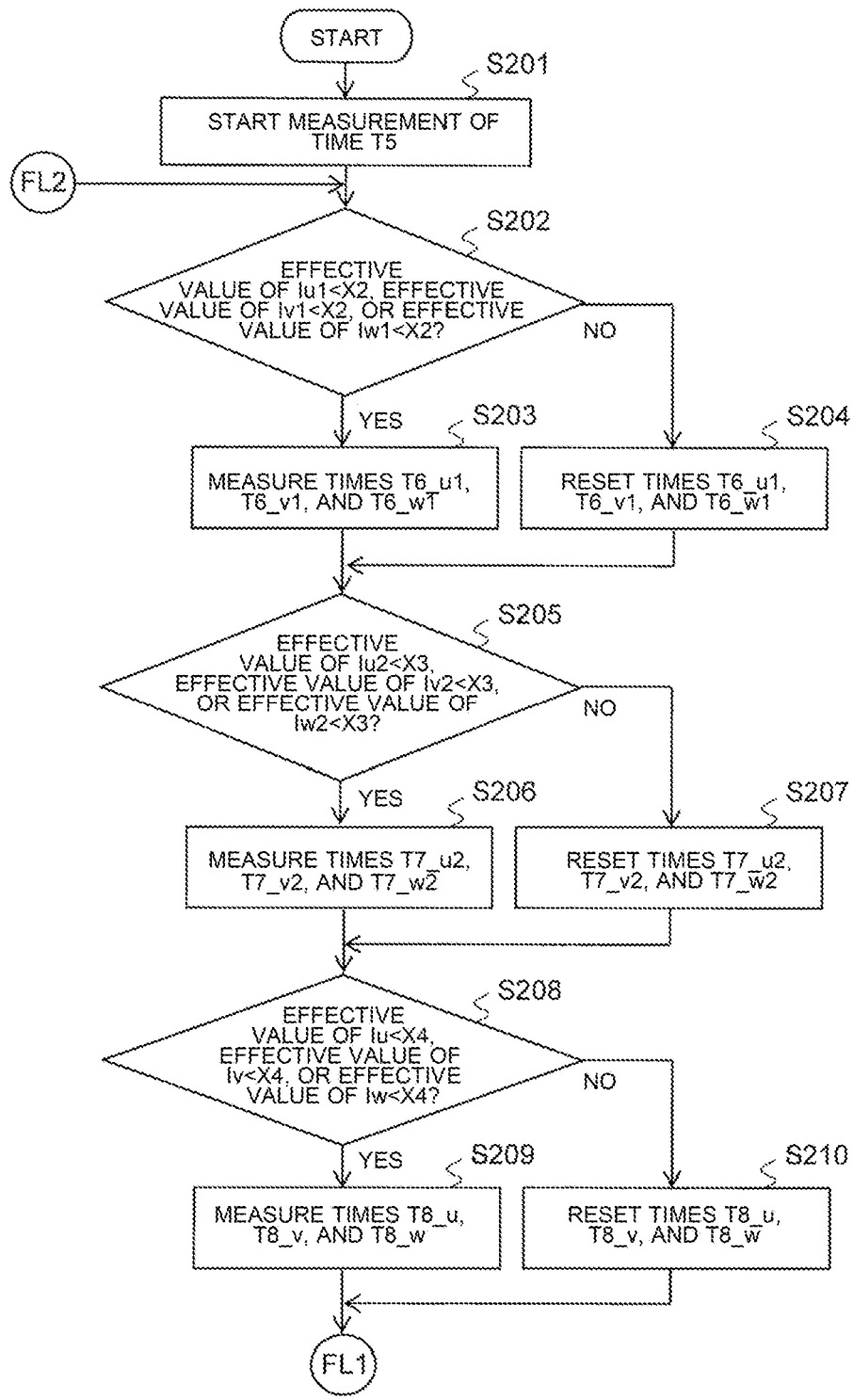
FIG. 7 is a flowchart showing operation procedures performed by the controller for detecting an off-failure in Embodiment 2.
Figure 8:
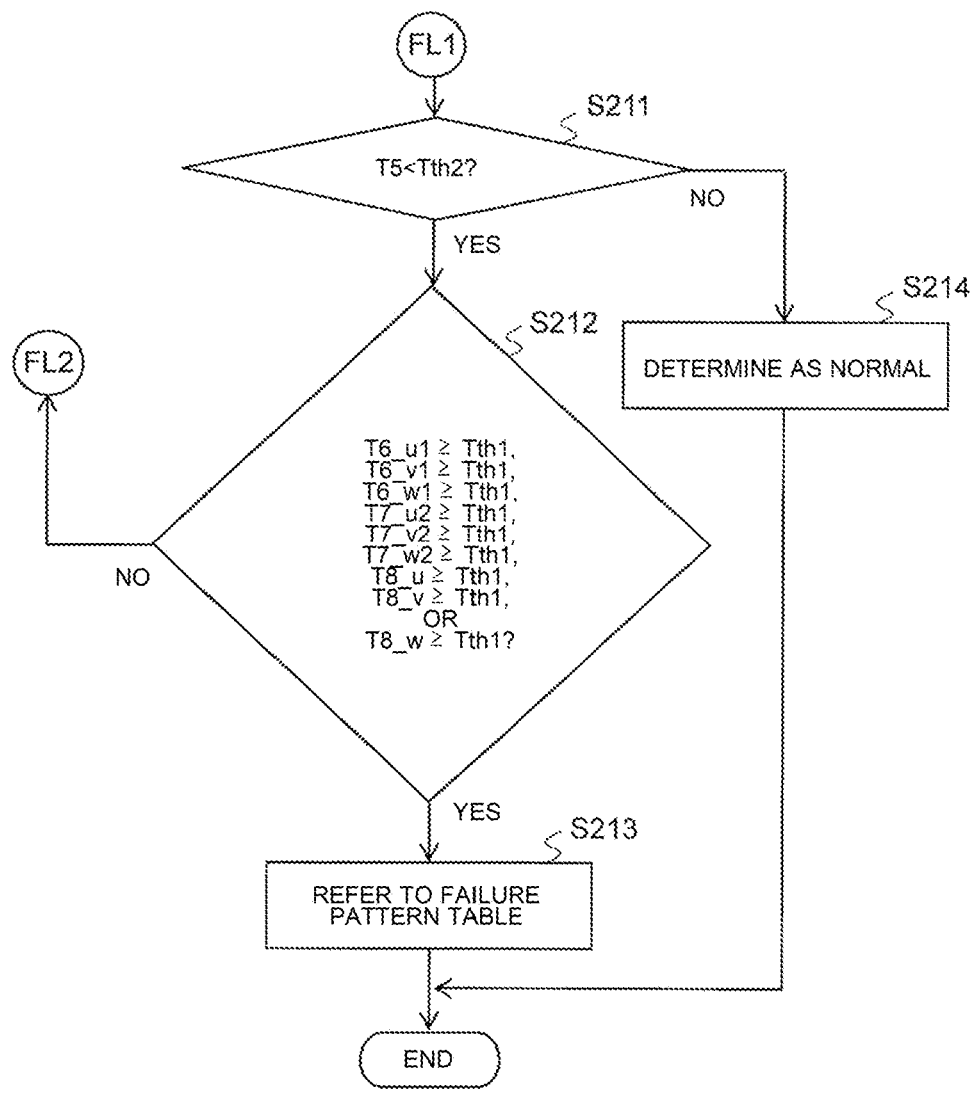
FIG. 8 is a flowchart showing operation procedures performed by the controller for detecting an off-failure in Embodiment 2.

First, a method for determining an off-failure will be explained. FIGS. 7 and 8 are flowcharts showing operation procedures performed by the controller for detecting an off-failure in Embodiment 2.

When a switching signal SW_ON, which switches the state of the switching device 9 from an off-state to an on-state, is sent to the switching device 9, the failure determination unit 74 starts the measurement of a time T5 elapsed since the switching signal SW_ON is sent (step S201). The failure determination unit 74 compares an effective value of a current Iu1 detected at the position PB with the current threshold X2 (step S202). When the comparison result indicates that the effective value of the current Iu1 is less than the threshold X2, the failure determination unit 74 measures a time T6_u1 in which the effective value of the current Iu1 is less than the current threshold X2 (step S203).

In addition, the failure determination unit 74 compares an effective value of a current Iv1 detected at the position PB with the current threshold X2 (step S202), and when the comparison result indicates that the effective value of the current Iv1 is less than the threshold X2, the failure determination unit 74 measures a time T6_v1 in which the effective value of the current Iv1 is less than the current threshold X2 (step S203). Moreover, the failure determination unit 74 compares an effective value of a current Iw1 detected at the position PB with the current threshold X2 (step S202), and when the comparison result indicates that the effective value of the current Iw1 is less than the threshold X2, the failure determination unit 74 measures a time T6_w1 in which the effective value of the current Iw1 is less than the current threshold X2 (step S203).

The failure determination unit 74 compares the times T6_u1, T6_v1, and T6_w1 with a time threshold Tth1 (step S212). The comparison result indicates that there is a time T6_K (where K is u1, v1, or w1) equal to or greater than the time threshold Tth1 among the times T6_u1, T6_v1, and T6_w1, the failure determination unit 74 determines that no current flows in the phase corresponding to the time T6_K. Meanwhile, when the determination result is NO is step S202, the failure determination unit 74 resets the times T6_u1, T6_v1, and T6_w1 (step S204).

The failure determination unit 74 compares an effective value of a current Iu2 detected at the position PC with the current threshold X3 (step S205). When the comparison result indicates that the effective value of the current Iu2 is less than the threshold X3, the failure determination unit 74 measures a time T7_u2 in which the effective value of the current Iu2 is less than the current threshold X3 (step S206). In addition, the failure determination unit 74 compares an effective value of a current Iv2 detected at the position PC with the current threshold X3 (step S205), and when the comparison result indicates that the effective value of the current Iv2 is less than the threshold X3, the failure determination unit 74 measures a time T7_v2 in which the effective value of the current Iv2 is less than the current threshold X3 (step S206).

Moreover, the failure determination unit 74 compares an effective value of a current Iw2 detected at the position PC with the current threshold X3 (step S205), and when the comparison result indicates that the effective value of the current Iw2 is less than the threshold X3, the failure determination unit 74 measures a time T7_w2 in which the effective value of the current Iw2 is less than the current threshold X3 (step S206). The failure determination unit 74 compares the times T7_u2, T7_v2, and T7_w2 with the time threshold Tth1 (step S212). The comparison result indicates that there is a time T7_L (where L is u2, v2, or w2) equal to or greater than the time threshold Tth1 among the times T7_u2, T7_v2, and T7_w2, the failure determination unit 74 determines that no current flows in the phase corresponding to the time T7_L. Meanwhile, when the determination result is NO is step S205, the failure determination unit 74 resets the times T7_u2, T7_v2, and T7_w2 (step S207).

The failure determination unit 74 compares an effective value of a current Iu flowing at the position PA, the current Iu being calculated from the currents Iu1 and Iu2, with the current threshold X4 (step S208). When the comparison result indicates that the effective value of the current Iu is less than the threshold X4, the failure determination unit 74 measures a time T8_u in which the effective value of the current Iu is less than the current threshold X4 (step S209). In addition, the failure determination unit 74 compares an effective value of a current Iv flowing at the position PA, the current Iv being calculated from the currents Iv1 and Iv2, with the current threshold X4 (step S208). When the comparison result indicates that the effective value of the current Iv is less than the threshold X4, the failure determination unit 74 measures a time T8_v in which the effective value of the current Iv is less than the current threshold X4 (step S209).

Moreover, the failure determination unit 74 compares an effective value of a current Iw flowing at the position PA, the current Iw being calculated from the currents Iw1 and Iw2, with the current threshold X4 (step S208). When the comparison result indicates that the effective value of the current Iw is less than the threshold X4, the failure determination unit 74 measures a time T8_w in which the effective value of the current Iw is less than the current threshold X4 (step S209). The failure determination unit 74 compares the times T8_u, T8_v, and T8_w with the time threshold Tth1 (step S212). The comparison result indicates that there is a time T8_M (where M is u, v, or w) equal to or greater than the time threshold Tth1 among the times T8_u, T8_v, and T8_w, the failure determination unit 74 determines that no current flows in the phase corresponding to the time T8_M. Meanwhile, when the determination result is NO is step S208, the failure determination unit 74 resets the times T8_u, T8_v, and T8_w (step S210).

When an off-failure occurs in a switch, the power line of a phase to which the failed switch is connected enters a disconnected state since then, and thus no current flows in the phase. Therefore, according to the above procedures, the failure determination unit 74 can detect a phase in which no current flows. By detecting a phase in which no current flows, the failure determination unit 74 can determine that the switch connected to the detected phase may have an off-failure. Other than the off-failure of a switch, causes of failure involving no current flow may include a disconnection of the power line connecting between the inverter 5 and the first motor 1, a disconnection of the power line connecting between the inverter 5 and the second motor 2, and a failure of the inverter 5. Therefore, the failure determination unit 74 refers to a failure pattern table stored in the memory 72 (step S213) to locate a failure position. Meanwhile, in step S211, the time threshold Tth2, which is a determination criterion, is set to a time so that the failure determination unit 74 performs at least one determination of step S212. For this reason, the failure determination unit 74 proceeds to step S212 after the first determination of step S211 and, when the determination of step S212 is NO, the process returns to step S202. When the time T5 is equal to or greater than the time threshold Tth2 in the second or subsequent determination of step S211, the failure determination unit 74 determines that the switching device 9 has no off-failure and normally operates (step S214).

A table to be used in the determination of off-failure will be explained. FIG. 9 is a diagram showing an example of a table that a memory of the controller shown in FIG. 2 stores. This table is for locating a failure position from failure patterns in which phases having current flows and phases having no current flows are indicated. FIG. 9 shows an excerpted part of the table. In the table of FIG. 9, a circle mark indicates that a current flows in the corresponding phase indicated in the top row, and a cross mark indicates that no current flows in the corresponding phase indicated in the top row.

Among the failure patterns shown in FIG. 9, a failure pattern 1, a failure pattern 7, and a failure pattern 10 will be explained as examples. The failure pattern 1 shows a case where the current Iu is not detected but all other currents are detected. In the failure pattern 1, because the current is not detected at the position PA, which is the position before the three-phase power line is branched off, it can be determined that the U-phase of the inverter 5 is not in an on-state. In the failure pattern 1, the reason why the currents Iu1 and Iu2 are detected is because a circulating current flows between the first motor 1 and the second motor 2. When no circulating current flows between the first motor 1 and the second motor 2, the failure corresponds to a failure pattern 4, and it is determined that the U-phase of the inverter 5 has a failure, as with the case of the failure pattern 1.

The failure pattern 7 shows a case where the current Iu1 is not detected but all other currents are detected. In the failure pattern 7, the current Iu is detected and this shows that the inverter 5 normally operates. In the failure pattern 7, the current Iu2 is detected and this shows that the switch 9a connected to the U2-phase normally operates and that the line of the U2-phase is not disconnected. Considering that no switch is connected to the U1-phase, it can be concluded that the failure pattern 7 represents a disconnection of the line of the U1-phase.

The failure pattern 10 shows a case where the current Iu2 is not detected but all other currents are detected. In the failure pattern 10, the current Iu is detected and this shows that the inverter 5 normally operates. In the failure pattern 10, the current Iu1 is detected and this shows that the line of the U1-phase is not disconnected. Meanwhile, because the current Iu2 is not detected, it can be concluded that the failure pattern 10 represents an off-failure of the switch 9a or a disconnection of the line of the U2-phase.

Here, an example will be explained of how to determine whether the failure is an off-failure of the switching device 9 or a disconnection of a line in failure patterns 11 and 13 shown in FIG. 9. There is a method for measuring a line voltage between a phase to be determined and another phase at the position PC after the inverter 5 is driven without the second motor 2 connected thereto and a switching signal SW_ON is sent. With this method, when the line voltage is not able to be measured correctly, it can be concluded that the switching device 9 is not normally operating and having an off-failure.

Figure 10:
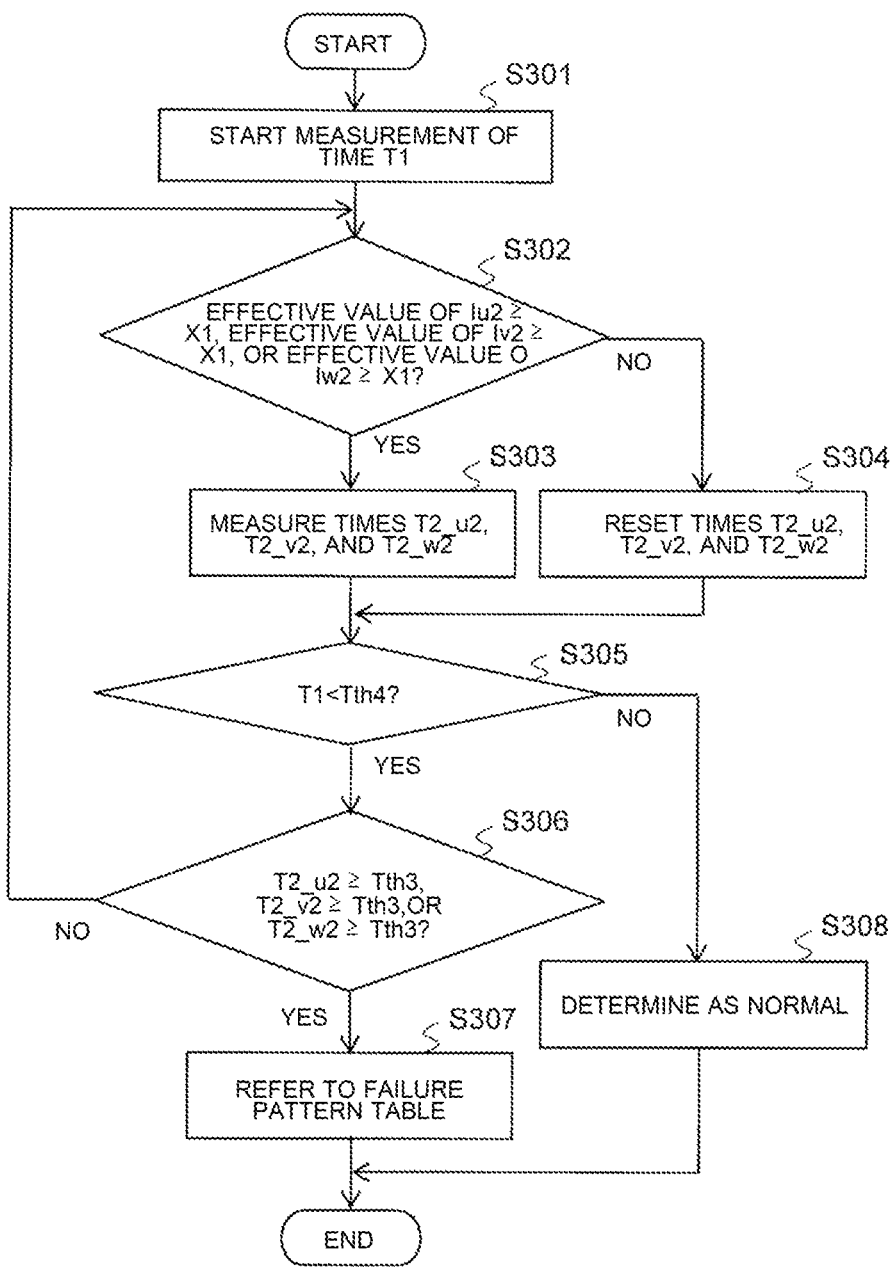
FIG. 10 is a flowchart showing operation procedures performed by the controller for detecting an on-failure in Embodiment 2.

Next, a method for detecting an on-failure will be explained. FIG. 10 is a flowchart showing operation procedures performed by the controller for detecting an on-failure in Embodiment 2.

When the switching control unit 75 sends a switching signal SW_OFF, which switches the state of the switching device 9 from an on-state to an off-state, to the switching device 9, the measurement of a time T1 elapsed since the switching signal SW_OFF is sent is measured (step S301). The failure determination unit 74 compares an effective value of a current Iu2 detected at the position PC with the current threshold X1 (step S302). When the comparison result indicates that the effective value of the current Iu2 is equal to or greater than the threshold X1, the failure determination unit 74 measures a time T2_u2 in which the effective value of the current Iu2 is equal to or greater than the current threshold X1 (step S303).

In addition, the failure determination unit 74 compares an effective value of a current Iv2 detected at the position PC with the current threshold X1 (step S302). When the comparison result indicates that the effective value of the current Iv2 is equal to or greater than the threshold X1, the failure determination unit 74 measures a time T2_v2 in which the effective value of the current Iv2 is equal to or greater than the current threshold X1 (step S303). Moreover, the failure determination unit 74 compares an effective value of a current Iw2 detected at the position PC with the current threshold X1 (step S302). When the comparison result indicates that the effective value of the current Iw2 is equal to or greater than the threshold X1, the failure determination unit 74 measures a time T2_w2 in which the effective value of the current Iw2 is equal to or greater than the current threshold X1 (step S303).

The failure determination unit 74 compares the times T2_u2, T2_v2, and T2_w2 with a time threshold Tth3 (step S306). The comparison result indicates that there is a time T2_N (where N is u2, v2, or w2) equal to or greater than the time threshold Tth3 among the times T2_u2, T2_v2, and T2_w2, the failure determination unit 74 determines that current flows in the phase corresponding to the time T2_N.

Figures 11, 12:
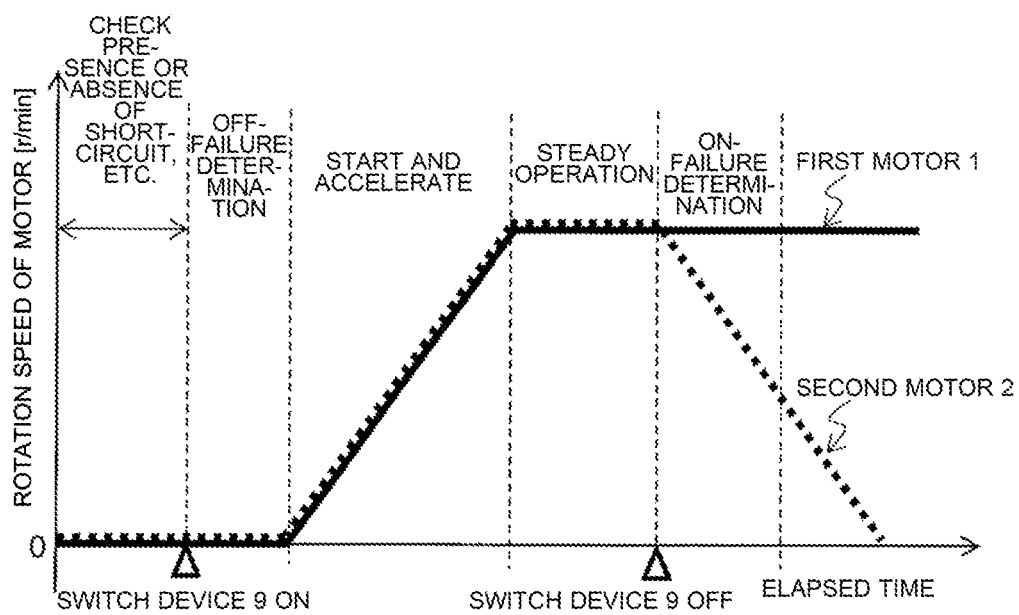
FIG. 11 is a diagram showing an example of another table that the memory of the controller shown in FIG. 2 stores.
FIG. 12 is a timing diagram showing timings at which failure determinations are performed for a switching device in Embodiment 2.

FIG. 11 is a diagram showing an example of another table that the memory of the controller shown in FIG. 2 stores. The table shown in FIG. 11 is for identifying a failed switch from failure patterns in which phases having current flows and phases having no current flows are indicated. In the table of FIG. 11, a circle mark indicates that a current flows in the corresponding phase indicated in the top row, and a cross mark indicates that no current flows in the corresponding phase indicated in the top row.

When an on-failure occurs in a switch, the power line of a phase to which the failed switch is connected is kept in a current-carrying state all the times, and thus current flows in the phase. Therefore, by detecting a phase in which current flows according to the above procedures, the failure determination unit 74 can determine that a switch connected to the phase in which the current flows has an on-failure. When there is the time T2_N (where N is u2, v2, or w2) equal to or greater than the time threshold Tth3 among the times T2_u2, T2_v2, and T2_w2, the failure determination unit 74 locates a failure position by referring to the failure determination pattern table shown in FIG. 11 (step S307). Meanwhile, in step S305, the time threshold Tth4, which is a determination criterion, is set to a time so that the failure determination unit 74 performs at least one determination of step S306. For this reason, the failure determination unit 74 proceeds to step S306 after the first determination of step S305 and, when the determination of step S306 is NO, the process returns to step S302. When the time T1 is equal to or greater than the time threshold Tth4 in the second or subsequent determination of step S305, the failure determination unit 74 determines that the switching device 9 has no on-failure and normally operates (step S308).

FIG. 12 is a timing diagram showing timings at which failure determinations are performed for the switching device in Embodiment 2. Switching from an operation with a single motor to an operation with two motors is difficult while motors are operating. For this reason, when switching to an operation with two motors in this case, the controller 7 temporarily stops output of the inverter 5, then turns the switching device 9 on, and restarts the first motor 1 and the second motor 2 in the state of parallel connection. In addition, for the time of initial start-up, the first motor 1 and the second motor 2 shall be started in the state of parallel connection.

Before an initial start-up, the controller 7 confirms the presence/absence of a short circuit in upper and lower arms of the inverter 5 and in the load-side components, such as between windings of the first motor 1 and the second motor 2 before the switching device 9 is changed to an on-state. For example, the power control unit 73 operates each combination of three combinations of the upper and lower arms of the inverter 5 to determine the presence/absence of abnormality for each combination of the upper and lower arms. Then, the switching control unit 75 turns the switching device 9 on and the failure determination unit 74 determines an off-failure of the switching device 9. After starting-up with two motors, when the operation is switched from the operation with two motors to an operation with a single motor, the failure determination unit 74 performs an on-failure determination. Then, the switching control unit 75 switches the operation with the single motor to the operation with two motors again, and the failure determination unit 74 performs an off-failure determination.

The motor control device 30 of Embodiment 2 locates a failure position by identifying one phase having no current or a combination of two or more phases having no currents, among the three phases of the first motor 1 and the second motor 2.

The operation and effects of Embodiment 2 will be explained. The controller 7 stores failure determination pattern tables, and by referring to the failure determination pattern tables, the controller 7 can locate a failure position of the switching device 9 based on information of currents detected by the current detection device 8. Not only failures of the switching device 9, but also failure positions of the inverter 5 and disconnection positions of the three-phase power lines can be located by the controller 7. Furthermore, the failure determination of the switching device 9 can be performed even when the motors are operating. Thus, the host controller 23 can control the air-conditioning apparatus 24 according to a failure position even when the motors are operating.

Embodiment 3

Embodiment 3 is an embodiment in which an operation to be performed after failure detection is added in the motor control device explained in Embodiment 1. In Embodiment 3, features that are the same as those described in Embodiments 1 and 2 will be denoted by the same reference signs, and their detailed descriptions will be omitted. In addition, because a method for determining a failure of the switching device 9 is the same as that described in Embodiment 2, its detailed description will be omitted in Embodiment 3. Because a configuration of the motor control device 30 of Embodiment 3 is the same as that described in Embodiment 2, its detailed description will be omitted.

Figure 13:
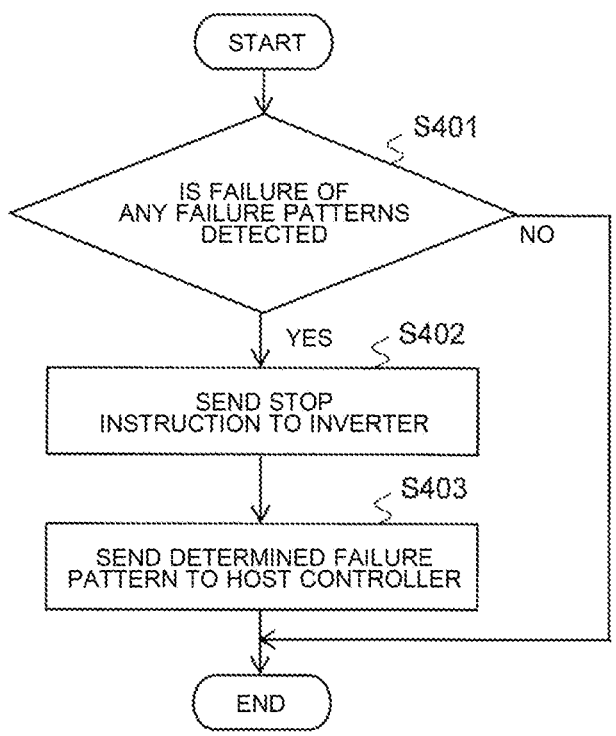
FIG. 13 is a flowchart showing part of processing to be performed by a controller of Embodiment 3 after an off-failure determination is performed at the time of initial start-up.
Figure 14:
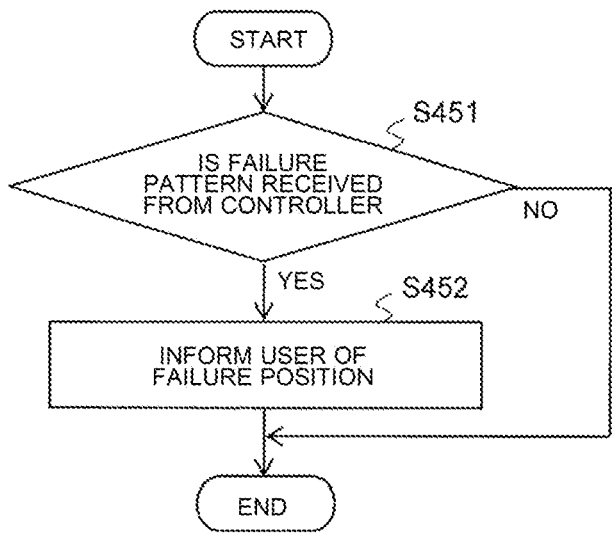
FIG. 14 is a flowchart showing part of processing to be performed by a host controller of Embodiment 3 after an off-failure determination is performed at the time of initial start-up.

An operation of the motor control device 30 of Embodiment 3 will be explained. An operation to be performed after the failure determination unit 74 detects a failure by the off-failure detection or the on-failure detection will be explained. FIG. 13 is a flowchart showing part of processing to be performed by a controller of Embodiment 3 after an off-failure determination is performed at the time of initial start-up. FIG. 14 is a flowchart showing part of processing to be performed by a host controller of Embodiment 3 after an off-failure determination is performed at the time of initial start-up.

When the failure determination unit 74 performs an off-failure determination and detects an failure corresponding to one of the failure patterns in the failure determination patterns (step S401), the power control unit 73 sends a stop command to the inverter 5 (step S402). Then, the failure determination unit 74 sends information on the failure pattern determined by the off-failure determination to the host controller 23 (step S403).

The host controller 23 receives the information on the failure pattern from the controller 7 (S451), and informs the user of a failure position based on the received failure pattern (S452). Examples of an informing method include a method that outputs an alarm sound. Furthermore, when the remote controller connected to the host controller 23 has a display (not shown), the host controller 23 may display the failure position on the display in the form of a message.

Figure 15:
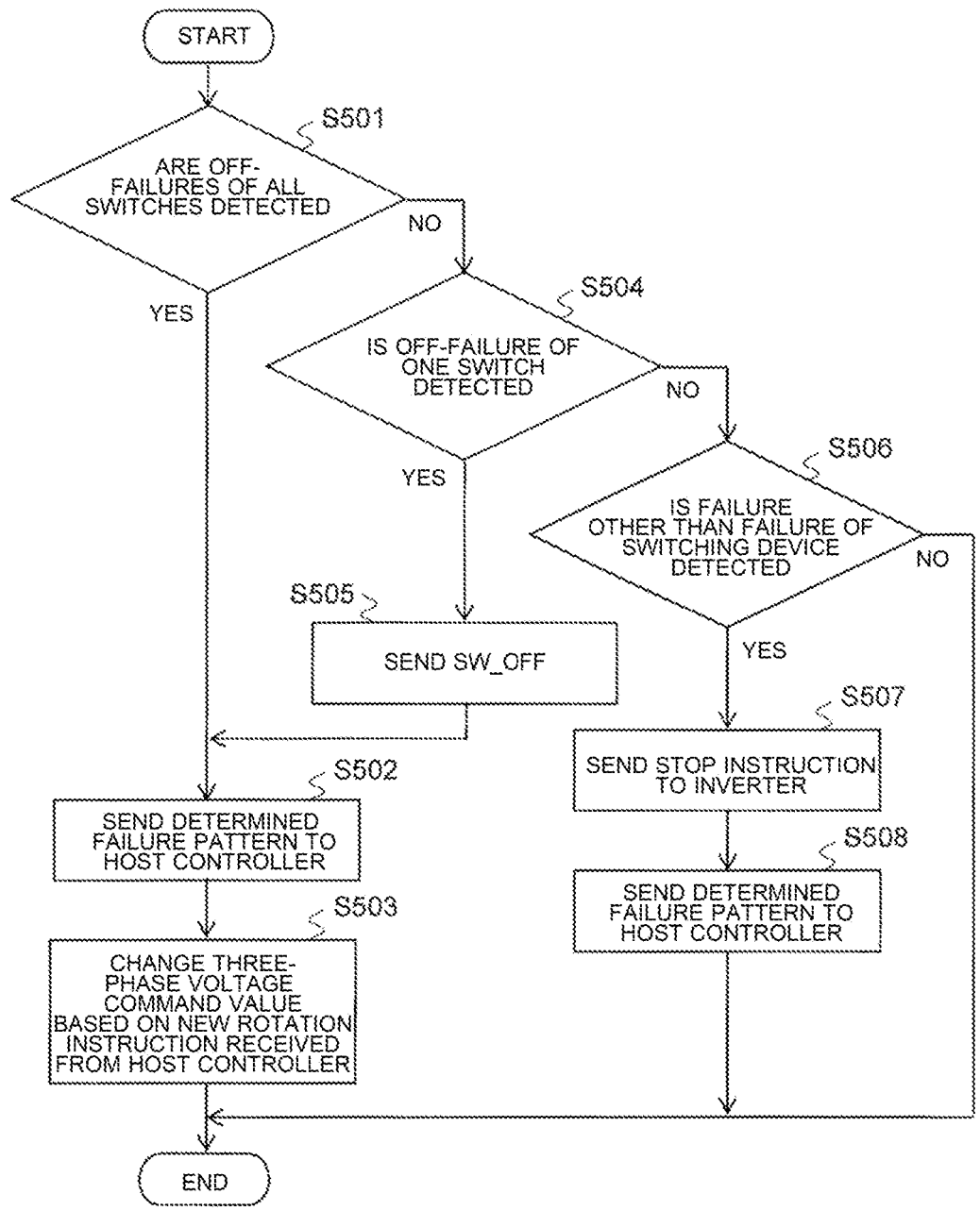
FIG. 15 is a flowchart showing part of processing to be performed by the controller of Embodiment 3 after an off-determination is performed at a time other than the time of initial start-up.
Figure 16:
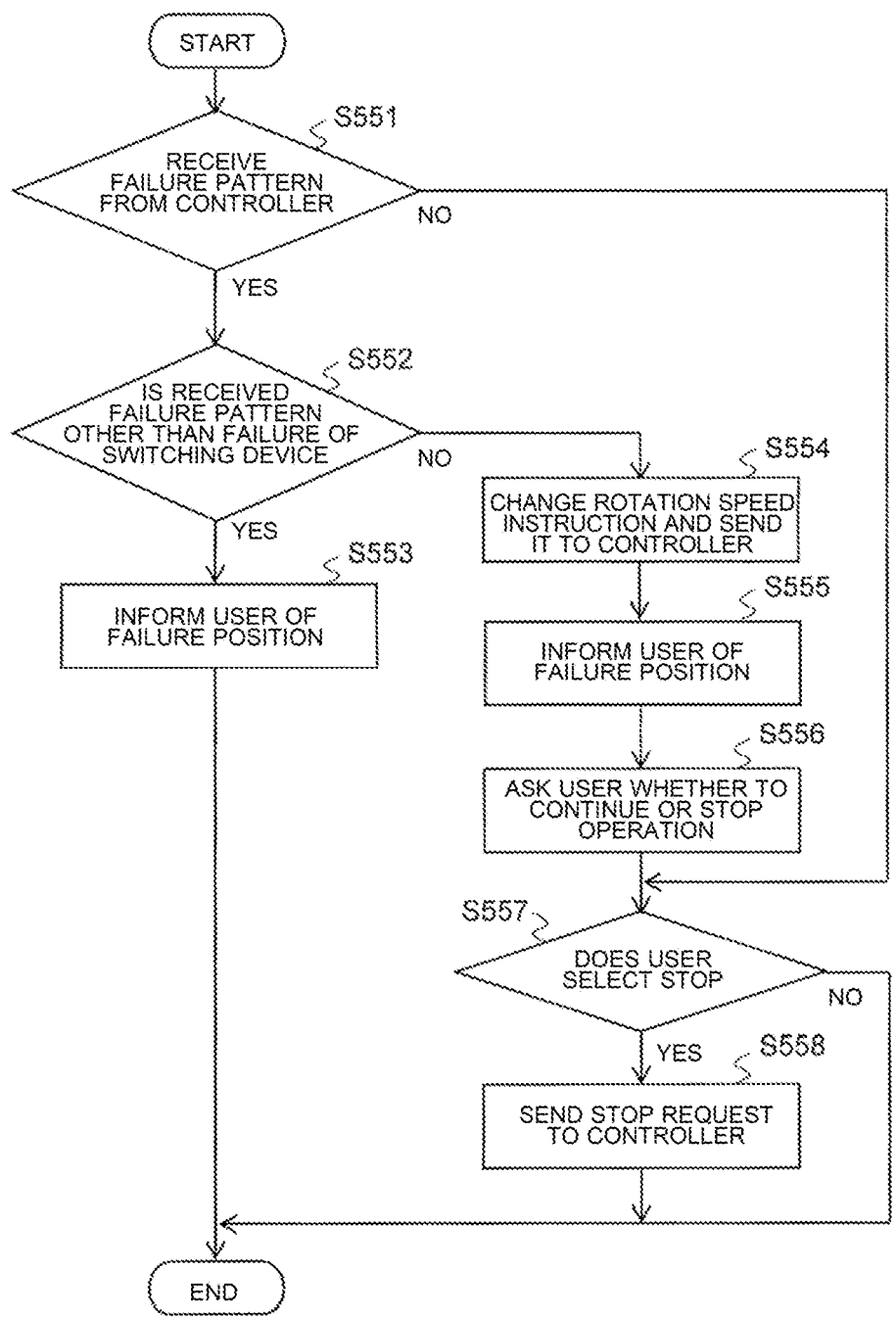
FIG. 16 is a flowchart showing part of processing to be performed by the host controller of Embodiment 3 after an off-failure determination is performed at a time other than the time of initial start-up.

Next, a case where an off-failure determination is performed at a time other than the initial start-up will be explained. FIG. 15 is a flowchart showing part of processing to be performed by the controller of Embodiment 3 after an off-determination is performed at a time other than the time of initial start-up. FIG. 16 is a flowchart showing part of processing to be performed by the host controller of Embodiment 3 after an off-failure determination is performed at a time other than the time of initial start-up.

The failure determination unit 74 performs an off-failure determination (steps S501 and S504). When, in the determination, off-failures are detected in all of the switches 9a and 9b connected to the same branch three-phase power line 11 (step S501), the failure determination unit 74 notifies the host controller 23 of the failure pattern determined by the off-failure determination (step S502). The failure pattern in this case is a failure pattern 13 shown in FIG. 9, for example.

The host controller 23 receives the failure pattern from the controller 7 (step S551), and when the received failure pattern is an off-failure of the switches 9a and 9b (step S552), the host controller 23 changes a rotation speed command value and sends the changed value to the controller 7 (step S554). More specifically, the host controller 23 sends a rotation speed command value that causes the first motor 1 to drive at such a rotation speed that can secure a required air volume for a desired heat exchange as much as possible but is not greater than the maximum rotation speed of the first motor 1.

Then, the host controller 23 informs the user of the failure position based on the failure pattern received from the controller 7 (step S555). The host controller 23 then asks the user whether to stop or continue the operation of the inverter 5 (step S556). When the user operates the remote controller (not shown) to select to stop the inverter 5 (step S557), the host controller 23 sends a stop command to the inverter 5 via the controller 7 (step S558). When the user selects to continue the operation or makes no selection, the power control unit 73 sends to the inverter 5 a three-phase voltage command value Vuvw_ref corresponding to the rotation speed command value received from the host controller 23 (step S503).

When the failure determination unit 74 performs an off-failure determination (step S504) and an off-failure of one of the switches 9a and 9b is detected, the switching control unit 75 performs the control of the switching device 9 described in Embodiment 1 (step S505). The failure pattern in this case is a failure pattern 10 or 12 shown in FIG. 9, for example. Then, the failure determination unit 74 notifies the host controller 23 of the failure pattern determined by the off-failure determination (step S502).

The host controller 23 receives the failure pattern from the controller 7 (step S551), and when the received failure pattern is an off-failure of one of the switches 9a and 9b (step S552), the host controller 23 changes a rotation speed command value (step S554). More specifically, the host controller 23 sends a rotation speed command value that causes the first motor 1 to drive at such a rotation speed that can secure a required air volume for a desired heat exchange as much as possible but is not greater than the maximum rotation speed of the first motor 1.

Then, the host controller 23 informs the user of the failure position based on the failure pattern received from the controller 7 (step S555). The host controller 23 then asks the user whether to stop or continue the operation of the inverter 5 (step S556). When the user operates the remote controller (not shown) to select to stop the inverter 5 (step S557), the host controller 23 sends a stop command to the inverter 5 via the controller 7 (step S558).

When the user selects to continue the operation or makes no selection, the power control unit 73 sends to the inverter 5 a three-phase voltage command value Vuvw_ref corresponding to the rotation speed command value received from the host controller 23 (step S503).

Furthermore, when the failure determination unit 74 performs an off-failure determination (step S506) and a failure other than the failures of the switching device 9 is detected, the power control unit 73 sends a stop command to the inverter 5 (step S507). Then, the failure determination unit 74 notifies the host controller 23 of the failure pattern determined by the off-failure determination (step S508). The failure patter in this case is any of failure patterns 1 to 9 and 11 shown in FIG. 9, for example. The host controller 23 informs the user of the failure position based on the failure pattern received from the controller 7 (step S553).

Figure 17:
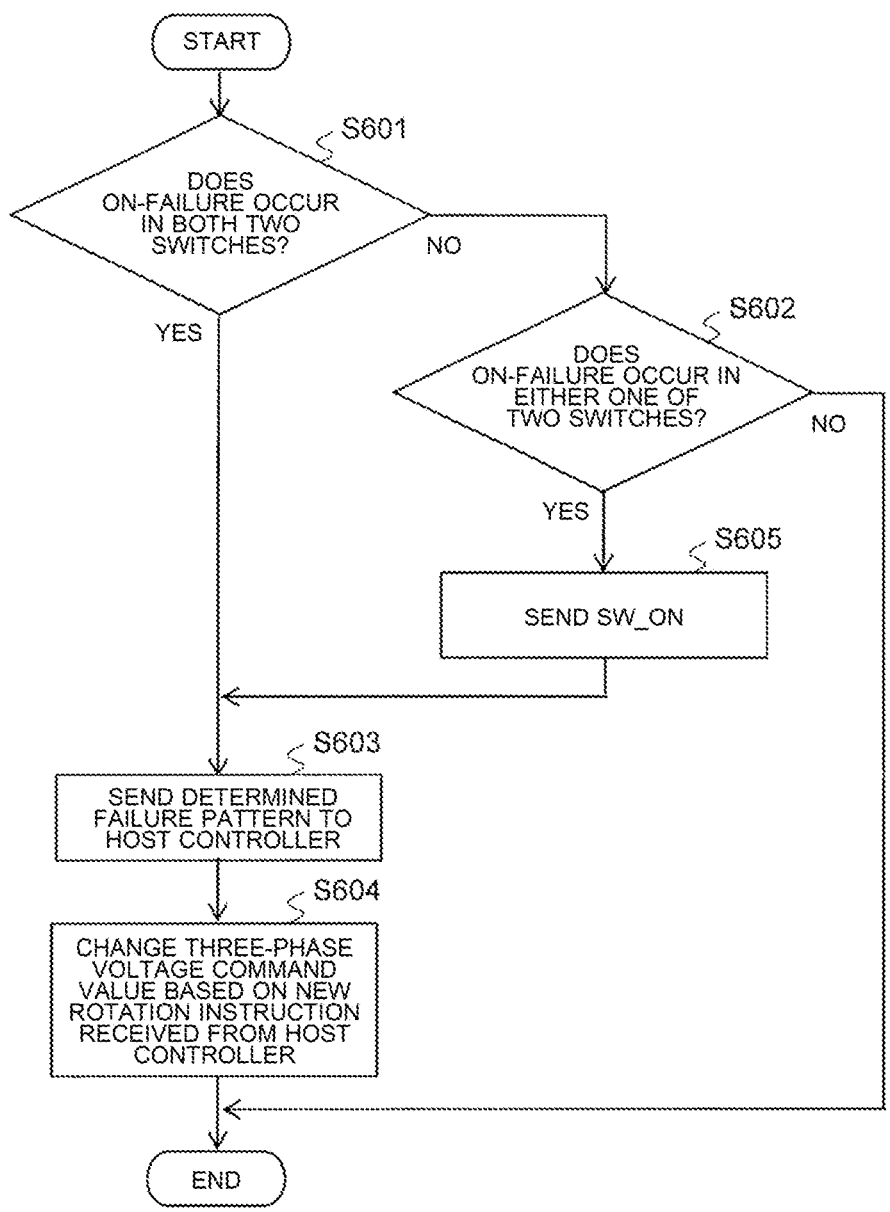
FIG. 17 is a flowchart showing part of processing to be performed by the controller of Embodiment 3 after an on-failure determination is performed.
Figure 18:
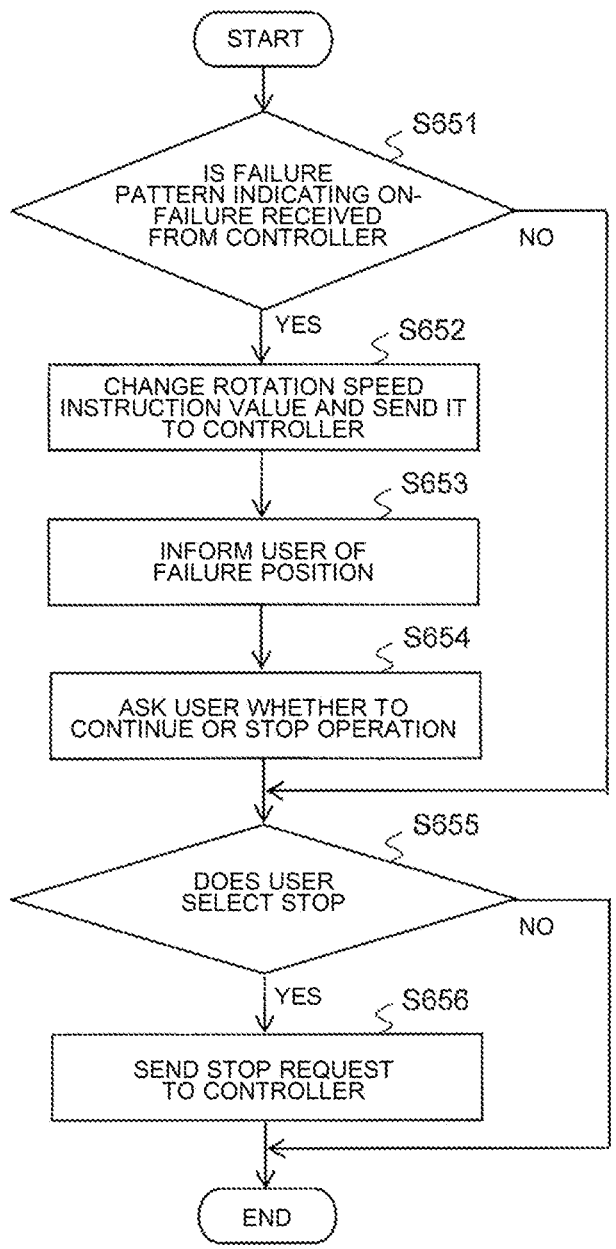
FIG. 18 is a flowchart showing part of processing to be performed by the host controller of Embodiment 3 after an on-failure determination is performed.

Next, a case where an on-failure determination is performed at a time other than the initial start-up will be explained. FIG. 17 is a flowchart showing part of processing to be performed by the controller of Embodiment 3 after an on-failure determination is performed. FIG. 18 is a flowchart showing part of processing to be performed by the host controller of Embodiment 3 after an on-failure determination is performed.

The failure determination unit 74 performs an on-failure determination (steps S601 and S602). When, in the determination, on-failures are detected in all of the switches 9a and 9b connected to the same branch three-phase power line 11 (step S601), the failure determination unit 74 notifies the host controller 23 of the failure pattern determined by the on-failure determination (step S603). The failure pattern in this case is a failure pattern 1 shown in FIG. 11, for example.

The host controller 23 receives the failure pattern from the controller 7 (step S651), and when the received failure pattern is an on-failure of the switches 9a and 9b, the host controller 23 changes a rotation speed command value and sends the changed value to the controller 7 (step S652). The rotation speed command value in this case is a value that causes the first motor 1 and the second motor 2 to drive at such a rotation speed that is at least the minimum rotation speed at which the first motor 1 and the second motor 2 can parallel drive and that can secure a required air volume for a desired heat exchange as much as possible.

Then, the host controller 23 informs the user of the failure position based on the failure pattern received from the controller 7 (step S653). The host controller 23 then asks the user whether to stop or continue the operation of the inverter 5 (step S654). When the user operates the remote controller (not shown) to select to stop the inverter 5 (step S655), the host controller 23 sends a stop command to the inverter 5 via the controller 7 (step S656).

When the user selects to continue the operation or makes no selection, the power control unit 73 sends to the inverter 5 a three-phase voltage command value Vuvw_ref corresponding to the rotation speed command value received from the host controller 23 (step S604).

When the failure determination unit 74 performs an on-failure determination (step S602) and an on-failure of one of the switches 9a and 9b is detected, the switching control unit 75 performs the control of the switching device 9 described in Embodiment 1 (step S605). The failure pattern in this case is a failure pattern 2 or 3 shown in FIG. 11, for example. Then, the failure determination unit 74 notifies the host controller 23 of the failure pattern determined by the on-failure determination (step S603).

The host controller 23 receives the failure pattern from the controller 7 (step S651), and when the received failure pattern is an on-failure of one of the switches 9a and 9b, the host controller 23 changes a rotation speed command value and sends the changed value to the controller 7 (step S652). The rotation speed command value in this case is a value that causes the first motor 1 and the second motor 2 to drive at such a rotation speed that is at least the minimum rotation speed at which the first motor 1 and the second motor 2 can parallel drive and that can secure a required air volume for a desired heat exchange as much as possible.

Then, the host controller 23 informs the user of the failure position based on the failure pattern received from the controller 7 (step S653). The host controller 23 then asks the user whether to stop or continue the operation of the inverter 5 (step S654). When the user operates the remote controller (not shown) to select to stop the inverter 5 (step S655), the host controller 23 sends a stop command to the inverter 5 via the controller 7 (step S656).

When the user selects to continue the operation or makes no selection, the power control unit 73 sends to the inverter 5 a three-phase voltage command value Vuvw_ref corresponding to the rotation speed command value received from the host controller 23 (step S604).

The air-conditioning apparatus 24 of Embodiment 3 informs the user of an abnormal position when detecting a failure of the switching device 9, a failure of the inverter 5, or a disconnection of the lines connecting to the first motor 1 and the second motor 2. In addition, after informing the user of the abnormal position, the air-conditioning apparatus 24 allows the user to select whether to stop or continue the operation.

The operation and effects of Embodiment 3 will be explained. By executing the on-failure determination and the off-failure determination of the switching device 9 by the controller 7, the states of the motors being driven can be acquired. Thus, when the air-conditioning apparatus 24 continues operation of the motor even after an on-failure or off-failure of the switching device 9 occurs, the controller 7 changes a rotation speed command corresponding to the number of motors being driven. As a result, the volume of air to be supplied to the heat-source-side heat exchanger 15 of the air-conditioning apparatus 24 can be brought close to an air volume actually required. The air-conditioning apparatus 24 can operate while reducing a differences between a required heat exchange capacity and an actual heat exchange capacity. Furthermore, the controller 7 can locate a failure position and inform the user of the failure position via the host controller 23. As a result, the user can acquire the failure position promptly and thus a time required to recover to a normal state from the failure detection can be reduced.

Embodiment 4

Embodiment 4 is an embodiment in which a refrigerant circuit of an air-conditioning apparatus and part of the operation of a controller after failure detection are different from those of Embodiment 3. In Embodiment 4, features that are the same as those described in Embodiments 1 to 3 will be denoted by the same reference signs, and their detailed descriptions will be omitted. Regarding the operations explained in Embodiment 4, operations different from the operations explained in Embodiment 3 will be explained in detail, and derailed descriptions for operations similar to those of Embodiment 3 will be omitted.

Figure 19:
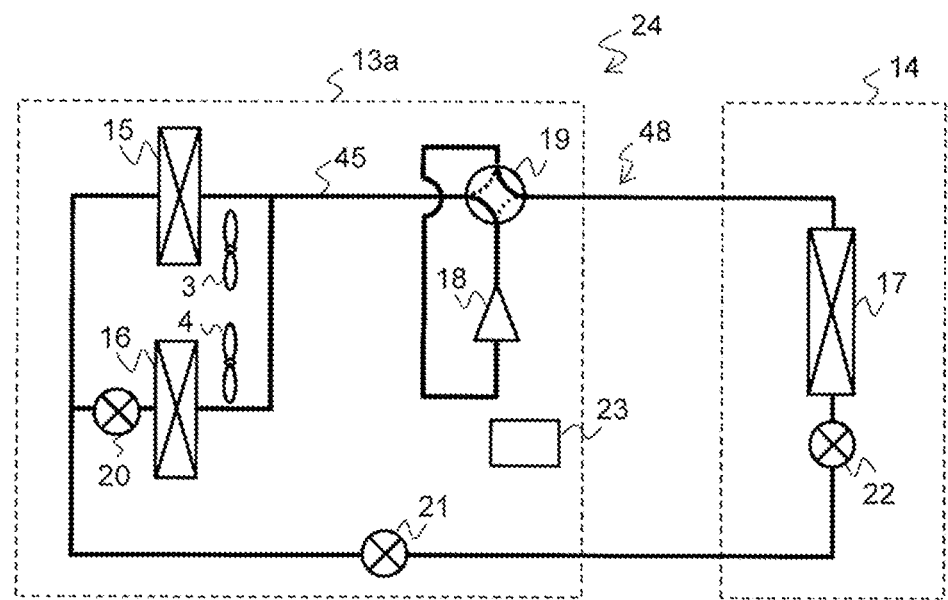
FIG. 19 is a refrigerant circuit diagram showing an example of a configuration of an air-conditioning apparatus according to Embodiment 4.

A configuration of an air-conditioning apparatus including a motor control device of Embodiment 4 will be explained. FIG. 19 is a refrigerant circuit diagram showing an example of a configuration of an air-conditioning apparatus according to Embodiment 4. In FIG. 19, illustration of the first motor 1, the second motor 2, and the motor control device 30 is omitted.

As shown in FIG. 19, in a heat-source-side unit 13a, the heat-source-side heat exchanger 15 and a heat-source-side heat exchanger 16 are installed in parallel in the refrigerant circuit 48. The fan 3 is installed corresponding to the heat-source-side heat exchanger 15 and the fan 4 is installed corresponding to the heat-source-side heat exchanger 16. The heat-source-side heat exchanger 15 is positioned near the fan 3 so that the heat-source-side heat exchanger 15 can be exposed to airflow generated by the fan 3. The heat-source-side heat exchanger 16 is positioned near the fan 4 so that the heat-source-side heat exchanger 16 can be exposed to airflow generated by the fan 4. A solenoid valve 20 is installed on the refrigerant pipe 45, which carries refrigerant to the heat-source-side heat exchanger 16. The solenoid valve 20 is connected between the solenoid valve 21 and the heat-source-side heat exchanger 16, and is configured to adjust the amount of refrigerant entering the heat-source-side heat exchanger 16.

Figure 20:
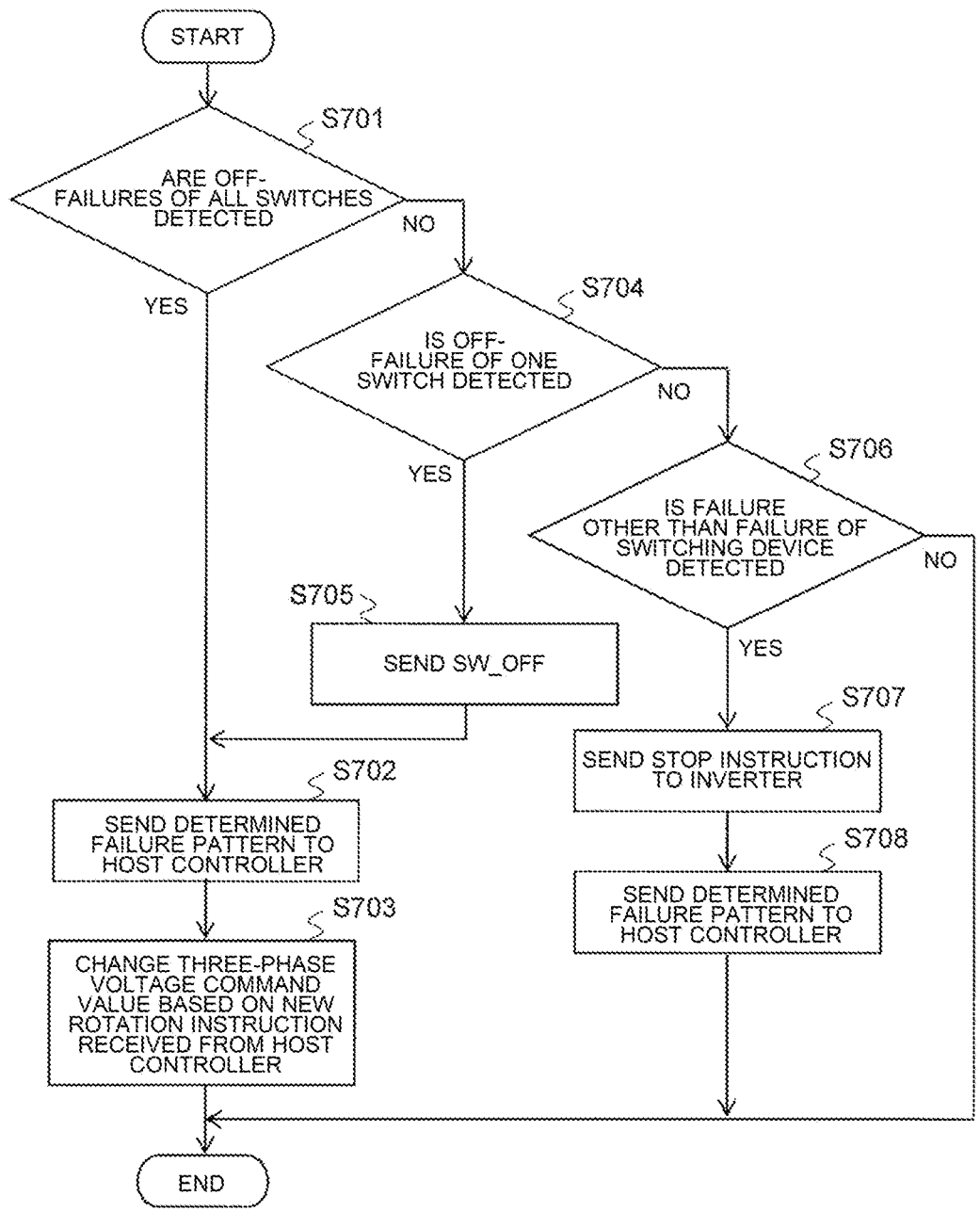
FIG. 20 is a flowchart showing part of processing to be performed by a controller of Embodiment 4 after an off-failure determination is performed at a time other than the time of initial start-up.
Figure 21:
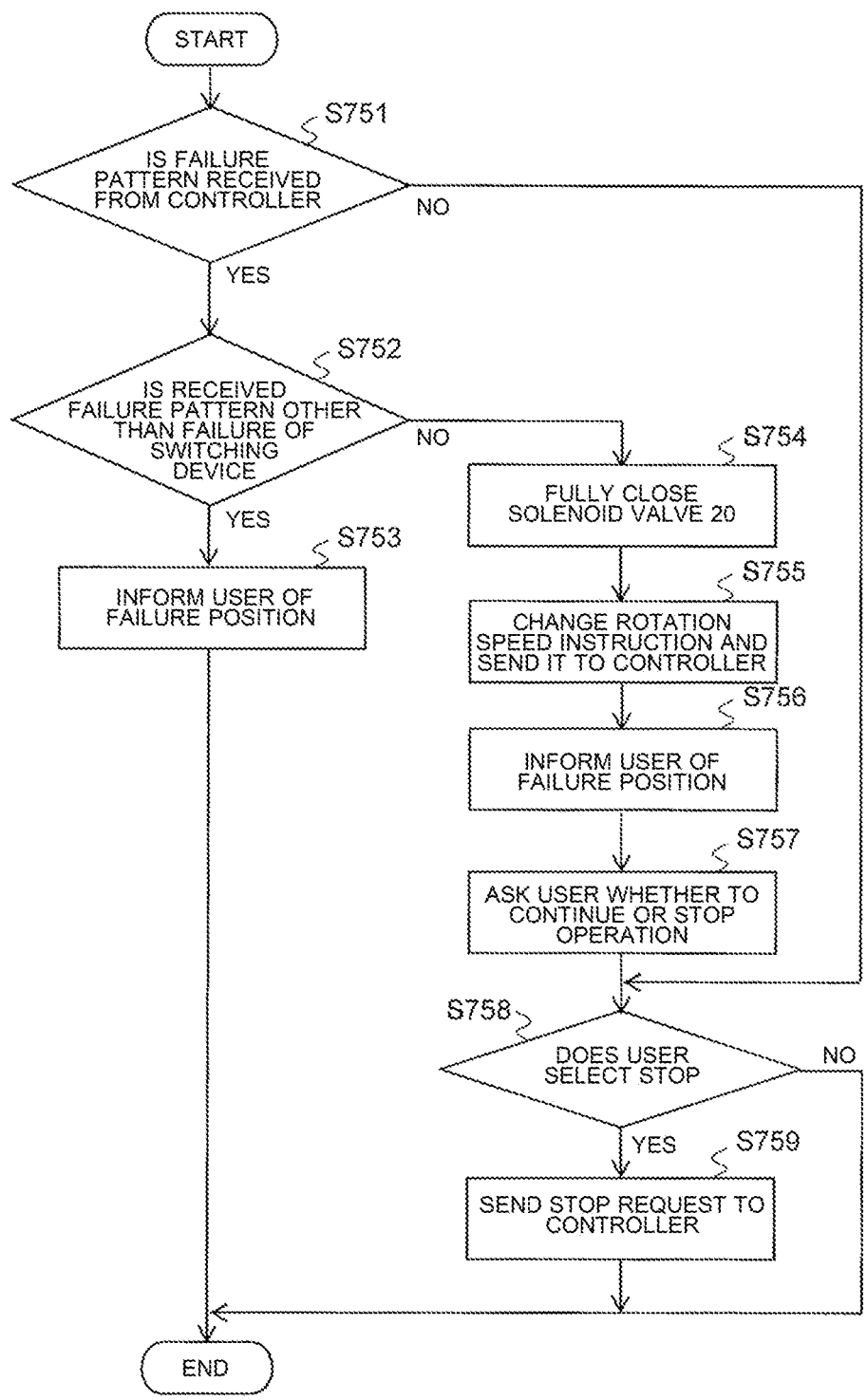
FIG. 21 is a flowchart showing part of processing to be performed by a host controller of Embodiment 4 after an off-failure determination is performed at a time other than the time of initial start-up.
Figure 22:
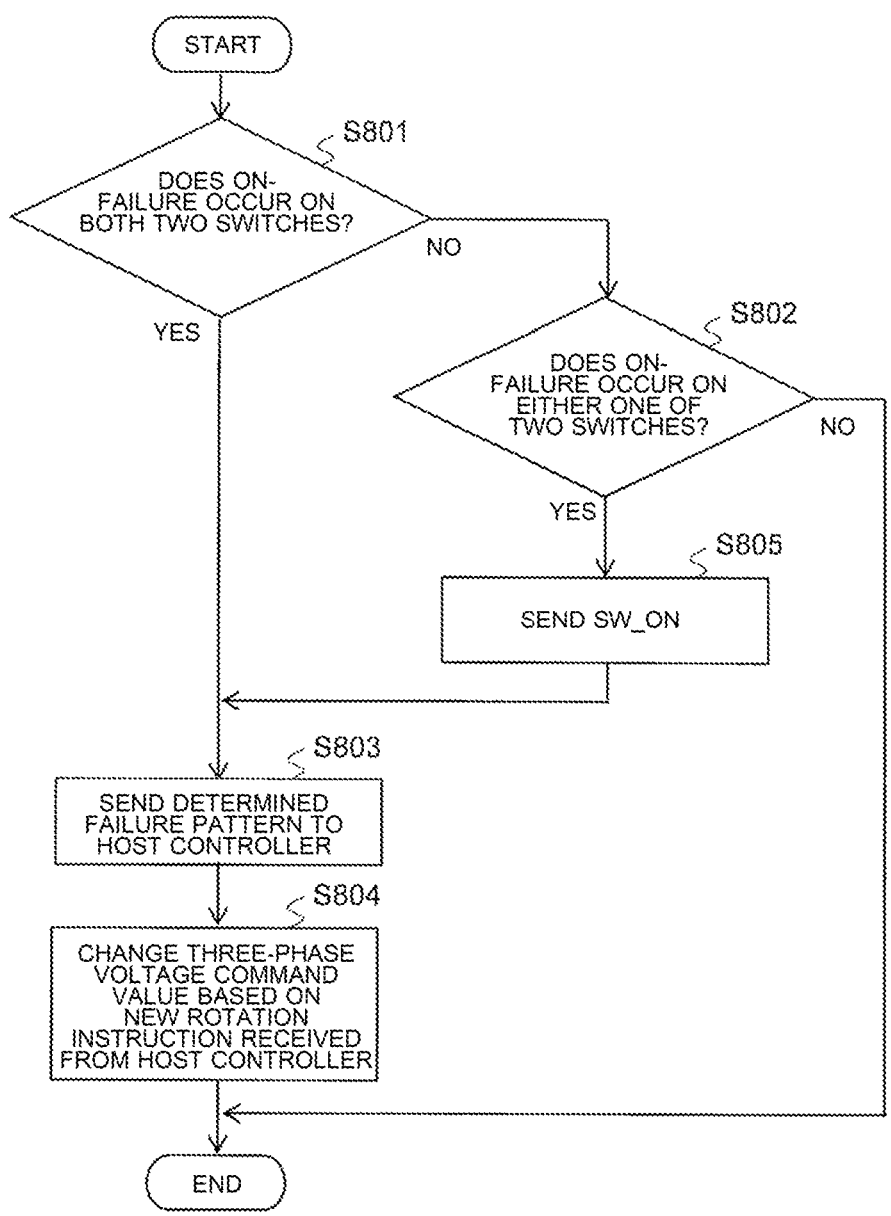
FIG. 22 is a flowchart showing part of processing to be performed by the controller of Embodiment 4 after an on-failure determination is performed.
Figure 23:
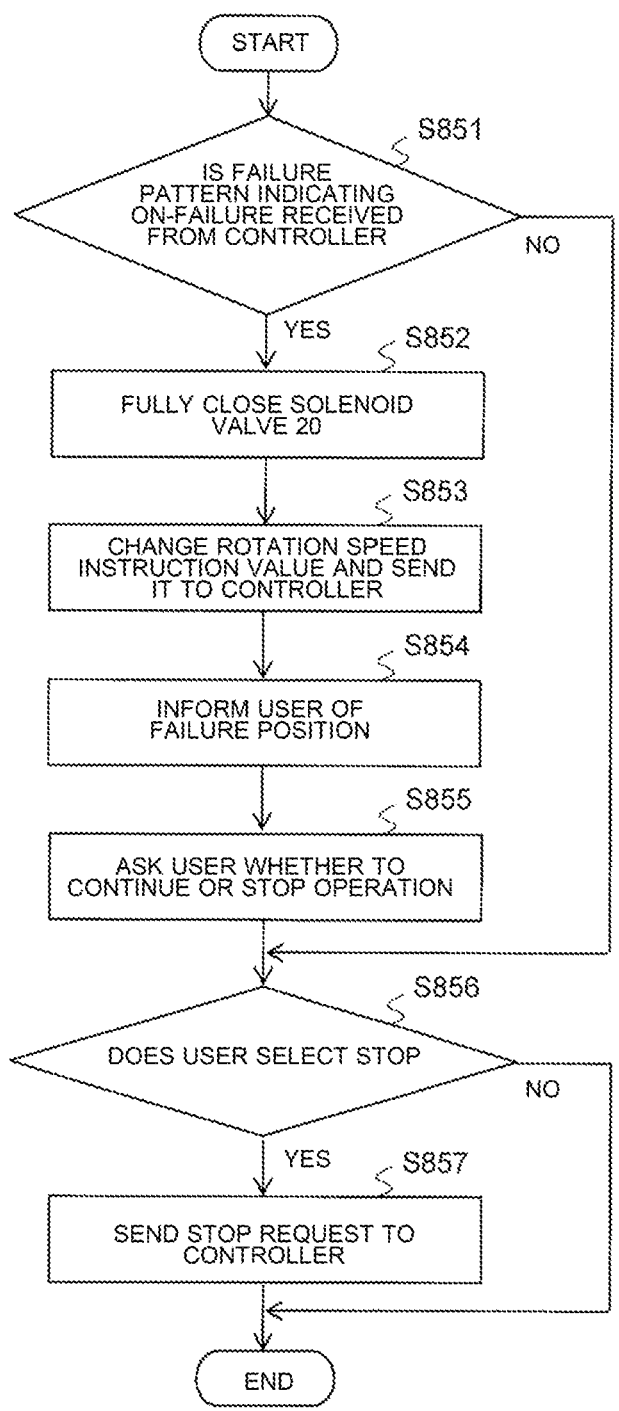
FIG. 23 is a flowchart showing part of processing to be performed by the host controller of Embodiment 4 after an on-failure determination is performed.

An operation of the air-conditioning apparatus of Embodiment 4 will be explained. FIG. 20 is a flowchart showing part of processing to be performed by a controller of Embodiment 4 after an off-failure determination is performed at a time other than the time of initial start-up. FIG. 21 is a flowchart showing part of processing to be performed by a host controller of Embodiment 4 after an off-failure determination is performed at a time other than the time of initial start-up. FIG. 22 is a flowchart showing part of processing to be performed by the controller of Embodiment 4 after an on-failure determination is performed. FIG. 23 is a flowchart showing part of processing to be performed by the host controller of Embodiment 4 after an on-failure determination is performed.

The steps S701 to S708 shown in FIG. 20 are the same as the steps S501 to S508 explained with reference to FIG. 15, and thus their detailed descriptions will be omitted. The steps S801 to S805 shown in FIG. 22 are the same as the steps S601 to S605 explained with reference to FIG. 17, and thus their detailed descriptions will be omitted.

When the flow shown in FIG. 21 and that shown in FIG. 16 explained in Embodiment 3 are compared, an operation of a new step S754 of FIG. 21 is added in Embodiment 4 before the host controller 23 sends a rotation speed command value to the controller 7. In addition, when the flow shown in FIG. 23 and that shown in FIG. 18 explained in Embodiment 3 are compared, an operation of a new step S852 of FIG. 23 is added in Embodiment 4 before the host controller 23 sends a rotation speed command value to the controller 7.

In Embodiment 4, the host controller 23 controls the opening degree of the solenoid valve 20 before sending a rotation speed command value to the controller 7 (step S754 of FIG. 21 and step S852 of FIG. 23). More specifically, when an off-failure or on-failure occurs in the switching device 9, the host controller 23 fully closes the solenoid valve 20 to prevent refrigerant from entering the heat-source-side heat exchanger 16.

The air-conditioning apparatus 24 of Embodiment 4 includes the motor control device 30, the heat-source-side heat exchangers 15 and 16 connected in parallel in the refrigerant circuit 48, two fans of the fans 3 and 4, and the first motor 1 and the second motor 2 corresponding to the fans 3 and 4. When a failure occurs in the switching device 9, the controller 7 controls so that refrigerant does not enter the heat-source-side heat exchanger 16 installed corresponding to the second motor 2.

The operation and effects of Embodiment 4 will be explained. When an off-failure occurs in the switching device 9, the amount of refrigerant entering the heat-source-side heat exchanger 16, which is arranged corresponding to the second motor 2 connected to the inverter 5 via the switching device 9, is limited. In this case, the refrigerant that can flows into the heat-source-side heat exchanger 16 if the solenoid valve 20 is not fully closed enters the heat-source-side heat exchanger 15. When the solenoid valve 20 is fully closed, the amount of refrigerant entering the heat-source-side heat exchanger 15 can be increased compared with a case where the solenoid valve 20 is not fully closed, and thus the heat exchange capacity of the heat-source-side heat exchanger 15 can be enhanced.

Furthermore, when an on-failure occurs in the switching device 9, the amount of refrigerant entering the heat-source-side heat exchanger 16, which is arranged corresponding to the second motor 2 connected to the inverter 5 via the switching device 9, is limited. Heat exchange is not performed in the heat-source-side heat exchanger 16, as with the case where the switching device 9 normally operates. As a result, when the solenoid valve 20 is fully closed, the total heat exchange capacity of the heat-source-side heat exchanger 15 and the heat-source-side heat exchanger 16 can be suppressed compared with a case where the solenoid valve 20 is not fully closed.

As described above, when the switching device 9 has an off-failure or on-failure, by fully closing the solenoid valve 20, the total heat exchange capacity of the heat-source-side heat exchanger 15 and the heat-source-side heat exchanger 16 can be controlled over a larger range compared with a case where the solenoid valve 20 is not fully closed. As a result, the air-conditioning apparatus 24 can be provided capable of operating while reducing a differences between a required heat exchange capacity and an actual heat exchange capacity when the switching device 9 has a failure.

Furthermore, when the switching device 9 has an failure, control is made so that refrigerant does not enter the heat-source-side heat exchanger 16 in which little heat exchange is performed or no heat exchange is required, and thus the refrigerant can be used efficiently. When the switching device 9 has an off-failure, the amount of air to be sucked by the fan 4, which is driven by the second motor 2, becomes zero $[m^3/h]$, and therefore, heat is not exchanged between the air and refrigerant even when the refrigerant enters the heat-source-side heat exchanger 16. Consequently, by controlling the refrigerant not to enter the heat-source-side heat exchanger 16, utilization efficiency of the refrigerant can be improved.

Moreover, an on-failure is detected when a parallel operation of the first motor 1 and the second motor 2 is changed to a single operation of the first motor 1. In the single operation of the first motor 1, heat exchange by the heat-source-side heat exchanger 16 becomes unnecessary. When the switching device 9 has an on-failure, air is sucked by the fan 4, which is driven by the second motor 2, and thus unnecessary heat exchange is performed in the heat-source-side heat exchanger 16 when refrigerant enters the heat-source-side heat exchanger 16. For this reason, by controlling the refrigerant not to enter the heat-source-side heat exchanger 16, unnecessary heat exchange of the heat-source-side heat exchanger 16 is avoided, and thus utilization efficiency of the refrigerant can be improved.

Embodiment 5

Embodiment 5 is an embodiment in which a timing for detecting a current used in a failure determination is different from that of Embodiment 2. In Embodiment 5, features that are the same as those described in Embodiments 1 and 2 will be denoted by the same reference signs, and their detailed descriptions will be omitted. Regarding the operations explained in Embodiment 5, operations different from the operations explained in Embodiment 2 will be explained in detail, and derailed descriptions for operations similar to those of Embodiment 2 will be omitted.

Figure 24:
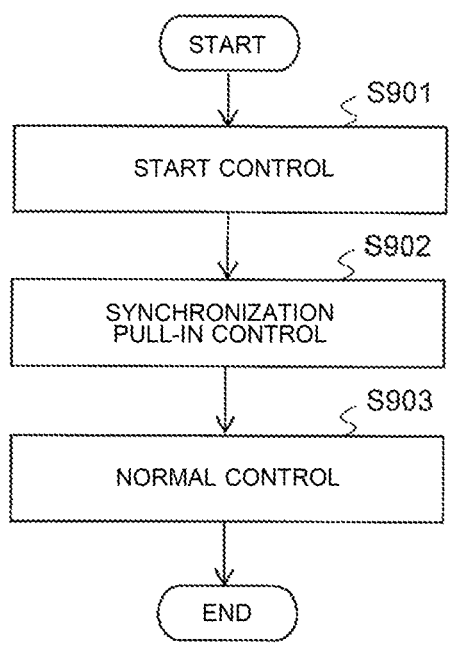

An operation of the motor control device 30 of Embodiment 5 will be explained. FIG. 24 is a flowchart showing part of processing to be performed by a controller of Embodiment 5 for controlling drive of a first motor after a switching device enters an on-state.

After the switching control unit 75 sends a switching signal SW_ON to the switching device 9, when the power control unit 73 executes a start-up control (S901), the first motor 1 and the second motor 2, which are stopped in advance, are restarted. Then, the power control unit 73 executes a synchronization pull-in control to the first motor 1 and the second motor 2 by referring to currents detected by the current detection device 8 (step S902). Here, in the synchronization pull-in control, the power control unit 73 controls a d-axis current to a constant value and controls the d-axis current so that a q-axis magnetic flux estimated value estimated from a current flowing in a motor becomes zero.

By the synchronization pull-in control, the power control unit 73 makes currents flowing in the first motor 1 and the second motor 2 constant. After executing the synchronization pull-in control, the power control unit 73 shifts to a normal control (step S903), and the first motor 1 and the second motor 2 are accelerated to target rotation speeds.

Figure 25:
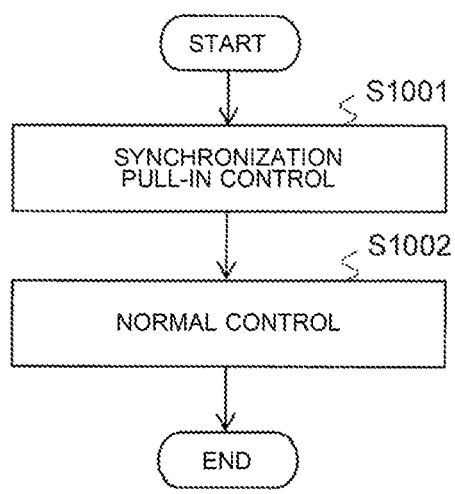
FIG. 25 is a flowchart showing part of processing to be performed by the controller of Embodiment 5 for controlling drive of the first motor after the switching device is turned off.

FIG. 25 is a flowchart showing part of processing to be performed by the controller of Embodiment 5 for controlling drive of the first motor after the switching device enters an off-state. After the switching control unit 75 sends a switching signal SW_OFF to the switching device 9, the power control unit 73 executes a synchronization pull-in control to the first motor 1 by referring to currents detected by the current detection device 8 (step S1001). After executing the synchronization pull-in control, the power control unit 73 shifts to a normal control (step S1002), and the first motor 1 is accelerated to a target rotation speed.

As a current to be used in the failure determination, the failure determination unit 74 uses a current detected during the synchronization pull-in control. A current value to be used in the failure determination is, for example, an average value of the current values sampled at fixed intervals during the synchronization pull-in control.

The motor control device 30 of Embodiment 5 executes a synchronization pull-in control to the first motor 1 and the second motor 2 after the state of the switching device 9 is switched, and the failure determination unit 74 thereof uses currents detected by the current detection device 8 during the synchronization pull-in control, for the failure determination.

The operation and effects of Embodiment 5 will be explained. When a load of a motor is small, a current flowing the motor during a normal operation may become very small, and thus the determination of whether or not the current is flowing cannot be made correctly in some cases. Meanwhile, during the synchronization pull-in control of a motor, a constant current can be made to flow regardless of a load. In Embodiment 5, the failure determination unit 74 uses currents detected during the synchronization pull-in control for a failure determination, and thus a probability of erroneous determination of whether or not a current is flowing can be lowered. As a result, accuracy of the failure determination can be improved.

Note that two or more of Embodiments 1 to 5 described above can be used in combination to obtain the abovementioned effects. In Embodiments 1 to 5, the controller 7 and the host controller 23 are explained as separate components, however, the controller 7 and the host controller 23 may be integrated in one component.

Furthermore, in Embodiments 1 to 5, a case where a load of a motor is a fan for an air-conditioning apparatus is explained, but the load is not limited to a fan for an air-conditioning apparatus. The failure determination of the switching device 9 explained in Embodiments 1 and 2 and the control after the failure determination of the switching device 9 explained in Embodiments 3 and 4 can be applied to various loads regardless of the load type of motor.

Reference Signs List

1: first motor, 2: second motor, 3, 4: fan, 5: inverter, 6: power source, 7, 7a: controller, 8: current detection device, 8a: first current detector, 8b: second current detector, 9: switching device, 9a, 9b: switch, 10: three-phase power line, 11: branch three-phase power line, 13, 13a: heat-source-side unit, 14: load-side unit, 15, 16: heat-source-side heat exchanger, 17: load-side heat exchanger, 18: compressor, 19: four-way valve, 20 to 22: solenoid valve, 23: host controller, 24: air-conditioning apparatus, 30: motor control device, 35: power converter, 45: refrigerant pipe, 48: refrigerant circuit, 51 to 56: switching element, 61 to 66: reverse current blocking element, 71: CPU, 72: memory, 73: power control unit, 74: failure determination unit, 75: switching control unit, 76: timer, 81: CPU, 82: memory

The invention claimed is:

1. A motor control device comprising:
 a power converter that converts a power into a three-phase voltage and supplies the three-phase voltage to two motors being connected in parallel;
 a three-phase power line that connects between one of the two motors and the power converter;
 a branch three-phase power line that is branched off from the three-phase power line and connects between the other of the two motors and the power converter;
 a relay having two switches that are provided on power lines of two phases of the branch three-phase power line and switch between an on-state and an off-state, the on-state being a state in which the power line of the corresponding phase is electrically connected between the other motor and the power converter, the off-state being a state in which the power line thereof is disconnected;
 a current transformer that detects three-phase currents flowing in the two motors; and
 a controller that controls the power converter and the relay corresponding to a speed command value and information of a current detected by the current transformer,
 the controller
 performs a failure determination by identifying a phase of a power line in which no current flows in the three-phase power line and the branch three-phase power line to locate a failure position of the relay, and
 when a failure is detected in one of the two switches in the failure determination, controls to change an on-state or off-state of the other switch, which operates normally, to coincide with a state of the failed switch.

2. The motor control device of claim 1, wherein
 the controller locates a failure position in the two switches, the power converter, the three-phase power line, or the branch three-phase power line by identifying one phase or a combination of two or more phases in which no current flows in the three-phase power line and the branch three-phase power line.

3. The motor control device of claim 1, wherein
 the controller, after a failure of the relay is detected, changes rotation speed command values for the two motors corresponding to a state of the failure of the relay.

4. The motor control device of claim 1, wherein
 the controller performs a failure determination after a state of the relay is switched.

5. The motor control device of claim 1, wherein
 the controller performs a synchronization pull-in control for the two motors after the state of the relay is switched, and
 uses a current detected by the current transformer during the synchronization pull-in control, in the failure determination.

6. An air-conditioning apparatus comprising:
 the motor control device of claim 1;
 two heat exchangers connected in parallel in a refrigerant circuit;

two fans provided for the two respective heat exchangers; and two motors to be controlled by the motor control device and provided for the two respective fans, wherein the controller controls so that, when a failure occurs in the relay, refrigerant does not enter the heat exchanger provided corresponding to the motor to which the relay is connected via the branch three-phase power line.

7. The air-conditioning apparatus of claim 6, wherein when the controller detects a failure of the relay, a failure of the power converter, or a disconnection of a line connecting to the motor, the controller informs a user of the failure position and allows the user to select whether to stop or continue an operation.

\* \* \* \* \*